US009268012B2

(12) United States Patent
Ghosh et al.

(10) Patent No.: US 9,268,012 B2
(45) Date of Patent: Feb. 23, 2016

(54) 2-D PLANAR VCSEL SOURCE FOR 3-D IMAGING

(71) Applicant: Princeton Optronics Inc., Mercerville, NJ (US)

(72) Inventors: Chuni Lal Ghosh, West Windsor, NJ (US); Jean Francois Seurin, Princeton Junction, NJ (US); Laurence S Watkins, Pennington, NJ (US)

(73) Assignee: PRINCETON OPTRONICS INC., Mergerville, NJ (US)

( * ) Notice: Subject to any disclaimer, the term of this patent is extended or adjusted under 35 U.S.C. 154(b) by 199 days.

(21) Appl. No.: 14/304,872

(22) Filed: Jun. 13, 2014

(65) Prior Publication Data

US 2015/0362585 A1    Dec. 17, 2015

Related U.S. Application Data

(63) Continuation-in-part of application No. 14/303,161, filed on Jun. 12, 2014.

(51) Int. Cl.
| *G01C 3/08* | (2006.01) |
| *G01S 7/481* | (2006.01) |
| *G01S 17/89* | (2006.01) |
| *G01S 17/02* | (2006.01) |
| *G01S 7/484* | (2006.01) |
| *H01S 5/42* | (2006.01) |
| *H01S 5/00* | (2006.01) |
| *H01S 5/022* | (2006.01) |

(52) U.S. Cl.
CPC .............. *G01S 7/4815* (2013.01); *G01S 7/484* (2013.01); *G01S 17/026* (2013.01); *G01S 17/89* (2013.01); *H01S 5/005* (2013.01); *H01S 5/02248* (2013.01); *H01S 5/423* (2013.01); *G01S 7/4816* (2013.01)

(58) Field of Classification Search
CPC ...... G01S 7/484; G01S 7/4815; G01S 7/4911
USPC ............................................... 356/5.01–5.08
See application file for complete search history.

(56) References Cited

U.S. PATENT DOCUMENTS

| 8,320,621 | B2 | 11/2012 | McEldowney |  |
| 2012/0038903 | A1* | 2/2012 | Weimer et al. | ............... 356/4.07 |
| 2012/0218389 | A1 | 8/2012 | Nowak et al. |  |
| 2012/0281293 | A1* | 11/2012 | Gronenborn et al. | ......... 359/619 |

FOREIGN PATENT DOCUMENTS

ZA        WO2013127975         9/2013

OTHER PUBLICATIONS

McCarthy A. et al., "Kilometer-range, high resolution depth imaging via 1560 nm wavelength single-photon detection", Optic Express, Apr. 2013, pp. 8904-8915, vol. 21, No. 7, Optical Society of America.

* cited by examiner

*Primary Examiner* — Thanh Luu

(57) ABSTRACT

An apparatus and a method are provided for 3-D imaging and scanning using a 2-D planar VCSELs source configured as a lightfiled optical source. VCSELs are configured in different 2-D spatial arrangements including single VCSEL, or preferably a group, cluster, or array each to be operated effectively as an independent VCSEL array source. A set of microlens and an imaging lens positioned at a pre-determined distance collimates radiation from each VCSEL array source to a set of parallel beams. The parallel beams from different VCSEL array sources generated in a rapid pre-determined timing sequence provide scanning beams to illuminate an object. The radiation reflected from the object is analyzed for arrival time, pulse shape, and intensity to determine a comprehensive set of distance and intensity profile of the object to compute a 3-D image.

20 Claims, 13 Drawing Sheets

2-D PLANAR VCSEL SOURCE FOR 3-D IMAGING

CROSS REFERENCE TO RELATED APPLICATION

This application is a Continuation-In-Part of the U.S. patent application Ser. No. 14/303,161 filed on Jun. 12, 2014 which claims priority benefit from the U.S. Provisional Patent Application No. 61/845,572 filed on Jul. 12, 2013, the contents of above mentioned applications are being incorporated by reference in their entirety.

BACKGROUND OF THE INVENTION

1. Field of the Invention

The present invention relates to a 3-D optical sensing and imaging apparatus using an optical illumination source comprising Vertical Cavity Surface Emitting Lasers (VCSEL), and in particular, a lightfield optical source including 2-D planar array of VCSELs.

2. Related Background Art

There are many applications such as military and civilian surveillance, security and monitoring equipment, medical imaging, biometric imaging, gesture recognition input devices for interactive video games, motion activated input devices, automotive safety devices, manufacturing environment, just to name a few, that depend on accurate proximity (or distance) measurement and imaging. One common element of apparatus used in these and similar other applications is three-dimensional (3-D) imaging of objects (or human subjects). Current proximity sensing imaging and scanning apparatus requiring sophisticated and complex optical sources, detectors and complex processors limit applications to just a few areas due to cost consideration. 3-D proximity sensing, imaging and scanning will come within the realm of everyday applications as the apparatus become less complex without compromising performance and cost.

Early methods to capture 3-D images of objects used stereoscopic cameras that basically work on similar principles as human eye. More specifically, two images are recorded at slightly different angles and the images are superimposed to generate a 3-D image. The method revisited more recently is described in a United State Patent Application Publication No. 2012/0218389 by Nowak et al on Aug. 30, 2012. One major requirement in this technique is that the distance between the two cameras have to be carefully calibrated using a complex procedure which limits the application to limited environment.

A more recent technology that has emerged for distance measurement is time of flight measurement of light. An object is illuminated using a short pulse of light and the reflected light measured by a high speed detector. The arrival time of the incident light pulse to the object and the reflected light pulse from the object to the detector provides a measurement of distance from the source to the detector. Accurate distance measurement with high resolution requires a high intensity light pulse with short rise time and a high speed detector. In a recent non-patent literature publication entitled "Kilometer-range, high resolution depth imaging via 1560 nm wavelength single-photon detection" published by A. McCarthy et al. in Optic Express Vol. 21, No. 7, April 2013, pp. 8904-8915, OSA, a sophisticated time of flight measurement is described. While the image resolution is quite high, it is only possible by using a customized superconducting narrow wire single-photon detector. Clearly, such sophisticated apparatus and technique is well out of the realm of everyday applications.

Simple methods for proximity or distance detection of objects involve illuminating an object with a light source, such as an LED, and measuring the intensity of the light reflected back. The reflected light intensity reduces as the object is moved further away from the light source and detector. The method relies on good object illumination from an intense highly collimated optical source as well as known reflectance of the objects. Differences in reflectance and even shapes of objects tend to change the detected light resulting in errors in distance measurement. The sources currently available have for a reasonable cost have low intensity and/or are highly divergent which limits the distance that can be accurately measured as the reflected intensity becomes lower than the detection limit of the detector or is similar to ambient light levels.

Recent developments in high speed cameras have led to the development of three dimensional imaging systems using pulsed illumination. The region is illuminated by a short light pulse and the camera records images at different delay times. The images are then analyzed to produce a three dimensional image record. As in all time of flight systems one of the key components is the short pulse high intensity source. In addition, increasing the intensity improves the signal to noise ratio and enables objects at greater distances to be measured and imaged with higher resolution. The spectral properties of the light source are also important since spectral filtering of the light reflected to the sensor can reduce background noise from ambient light.

Most modern apparatus tend to combine different methods hybrid imaging method approach to enhance precision and reliability of images. One drawback of a hybrid method is that each method requires an optical source that is specialized for that particular method and is therefore impractical to implement. In a WIPO Patent Application Publication No. WO2013/127975 by IEE International Electronics & Engineering S.A on Sep. 13, 2013, a hybrid three-dimensional imager is described where a specialized illumination source using a VCSEL array chip to generate spatially coded structured light field is employed. It is disclosed that when a transistor for each VCSEL is integrated with the laser array chip, matrix addressing of the array is feasible, except it becomes impractical for very large arrays. The publication further discloses that a separate chip with driver circuits may alternatively bonded to the laser array by flip-chip bonding. Furthermore, structured light may be changed to a smooth flat illumination mode by positioning a switchable diffuser in front of the laser surface. Although the publication discloses use of VCSEL source for time of flight, stereovision and 2-D imaging, it does not specifically describe how different methods are combined within the framework to generate a 3-D image.

In a U.S. Pat. No. 8,320,621 issued to McEldowney on Nov. 27, 2012, a depth projector system including a light source using integrated VCSEL array to illuminate a capture area is described. A 3-D image is generated by a dispersive optical element (DOE) in the capture area. A 3-D camera senses the 3-D image. While the apparatus disclosed therein embodies 3-D imaging methods, it requires very sophisticated equipment and computing technologies to recognize and track human gestures and movements suitable for a gaming environment. The apparatus and method described therein is not particularly suited for simple applications mentioned earlier, or at a lower cost to expand usage to application other than gaming.

SUMMARY OF THE INVENTION

It can be appreciated that there is a need for 3-D proximity sensing, imaging and scanning apparatus that is accurate but not extensively complicated to operate and is suitable for many everyday applications without incurring excessive cost. In this invention, an important aspect of high power optical sources having low divergence and high speed operation capabilities is particularly addressed. In this invention a high intensity optical source particularly suited for sensing, imaging and scanning apparatus for different applications and under different ambient light is provided.

In this invention a lightfield optical source for 3-D sensing, imaging and scanning application is provided. In one aspect of the invention, the optical source is configured to generate a lightfield illumination pattern using an array of microlens, each microlens registered with a corresponding VCSEL that may include a single VCSEL, groups, clusters, or arrays of a plurality of VCSELs depending upon optical power and illumination patterns/sequence required in a given application. The lightfiled illumination is generated by placing an additional imaging lens positioned such that the microlens array is at the object plane or focal plane of the imaging lens. A plurality of scanning beams with distance dependent varying diameters is generated in a region of interest.

In one aspect, the lightfiled optical source generates a programmable scanning beam when operated in a pulse mode. The lightfiled optical source comprises a single VCSEL or preferably, groups, clusters, or arrays of a plurality of VCSELs. The optical source is electrically configured to operate in one or more programmable modes to emit radiation from VCSELs in individually addressable mode, or more preferably in groups, clusters, or arrays, each to be operated as a VCSEL array source in addressable mode. A set of microlens each aligned and registered with a VCSEL array source positioned between the optical source and an imaging lens, for generating a wide range of illumination pattern.

In another aspect of the invention each scanning beam incident upon an object reflects radiation, intensity of which is distance dependent. A receiver placed to receive reflected radiation generates signals such that the signal received from an object located farther away exhibits a waveform that is sharply focused whereas a signal received from an object located at a shorter distance exhibits a waveform that is broader. The distance of the object may be computed using the width as well as the intensity of the waveform. A time synchronized measurement of waveform parameters of signals generated from reflected radiation provides data for distance as well as lateral positions of objects for the processor to compute a 3-dimensional image.

In one aspect of the invention VCSELs are electrically connected to generate a uniform illumination pattern to illuminate an area or region of interest such that different objects or different parts of an object reflect incident radiation in proportion to their distance from the optical source and their surface features and textures. In one mode of operation electrical signals proportional to the intensity of the reflected radiation received at a receiver is processed to determine proximity or distance.

In another mode of operation, each VCSEL in the optical source is electrically connected to be operated in a pulsed mode in a pre-determined timing sequence to illuminate a different region of the area of interest, one region at a time. Time of flight measured synchronously with the sequence of illumination not only provides information regarding the depth (distance) of the object but also lateral position of the object in the same measurement. In one variant embodiment, the time of flight in conjunction with the intensity measurement provides relevant and sufficient information to the processor to compute a 3-dimensional image of the object.

In one embodiment of the invention individually addressable VCSELs or VCSEL array sources are programmed to generate a pre-determined time sequenced illumination pattern in a pulse mode in different regions within an area of interest. A synchronous detection of the reflected radiation is used to compute a distance associated with each of the reflected radiation pulses originating from an object or from different parts of the object. In conjunction with the synchronous intensity measurement of the reflected radiation, a 3-dimensional image is computed in the processor.

In a variant embodiment reflected radiation is detected using a photodetector array substantially matched with the VCSEL array to provide a structured time synchronized illumination and detection means to measure a time of flight and intensity of the reflected radiation for more accurate proximity sensing, imaging and scanning applications.

In one aspect of the invention, the plurality of VCSELs and/or individual VCSEL are connected to be operated in addressable mode. One advantage of operating the optical source in addressable mode is to be able to dynamically reconfigure illumination patterns as well as intensity of the optical source to adapt to different applications and ambient light levels. VCSELs may be designed to operate all at same wavelength or different wavelengths in different sections of the optical source arranged in specific array patterns or randomly to suit to specific illumination requirement.

In a different aspect of the invention all VCSELs may be monolithically integrated in a VCSEL array chip for compact and more reliable optical sources. A VCSEL array chip comprises one, or more than one VCSEL array arranged in groups, clusters or arrays. Advantageously, each group, cluster or array on an array chip act as individual sources that may be electrically connected to operate simultaneously, or in various programmable modes to activate each one of those individual sources in a pre-determined timing sequence so as to generate one or more different illumination patterns. Furthermore, group, clusters, or arrays forming individual sources on an array chip are individually programmable to reconfigure and change the illumination pattern dynamically.

In one variant embodiment additional optical components may be employed to further collimate low divergence VCSEL emission. This aspect is particularly suited for high resolution proximity sensing, imaging and scanning. In particular, in a 3-D imaging and scanning apparatus a structured illumination source and/or receiver may be configured using additional optical components registered specifically with respective source and detector elements. In some embodiments the optical components are integrated with individual VCSELs or more preferably, with groups, clusters or arrays of VCSELs on an array chip, or with the entire array chip.

BRIEF DESCRIPTION OF THE DRAWINGS

Different aspects of the invention describing a broad framework of the invention are presented in the specification which will be better understood and appreciated in conjunction with the drawing figures in which—

DETAILED DESCRIPTION OF THE INVENTION

Figure 1:
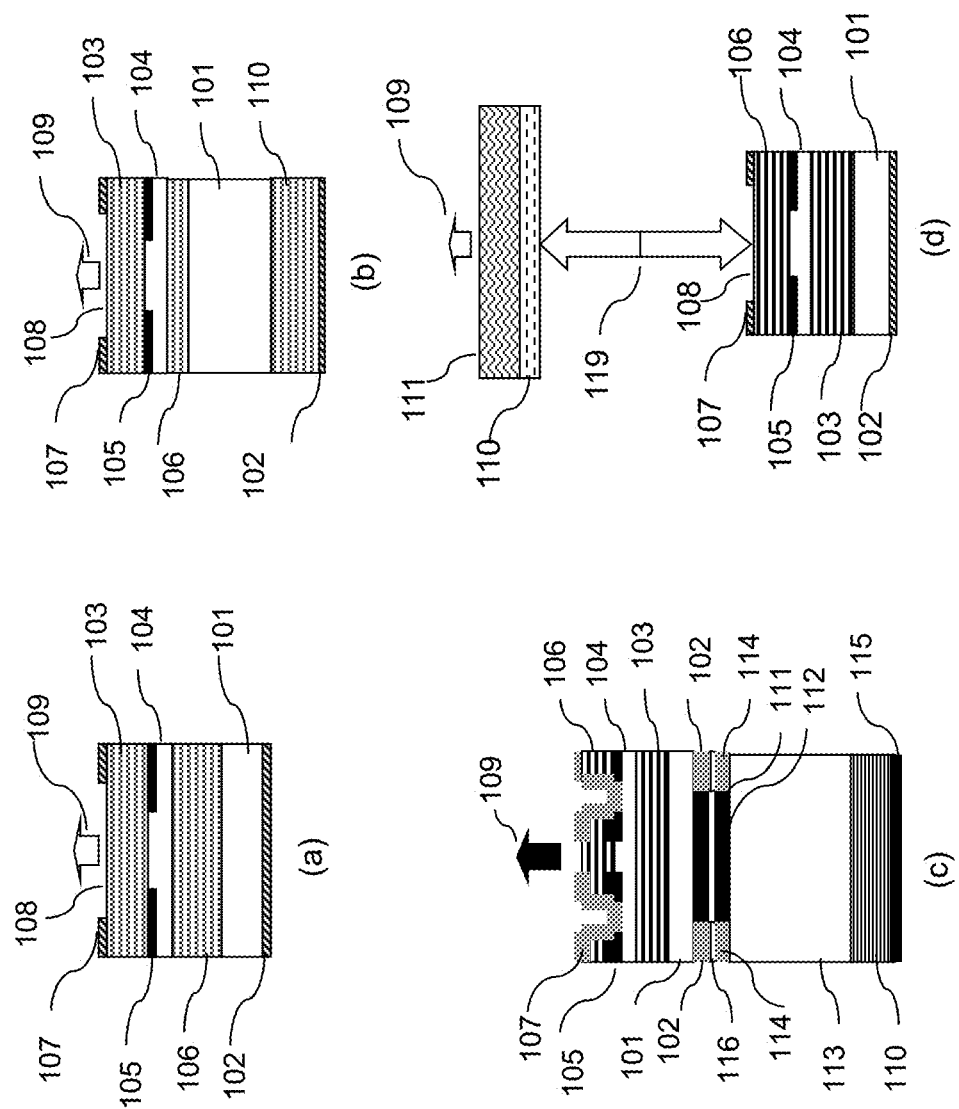
FIG. 1 shows a VCSEL devices configured in a top-emitting mode, (a) self-emitting two reflector VCSEL, (b) integrated extended cavity three reflector VCSEL, (c) extended cavity three reflector VCSEL with third reflector bonded to the device, and (d) extended cavity three reflector VCSEL with an external third reflector.

A broad framework and main principles and important aspects of the invention are disclosed using exemplary embodiments that are represented in different drawing figures. For clarity and ease of description, each embodiment includes only a few aspects. However, different aspects presented in each embodiment may be practiced separately or in various combinations and sub-combinations. Many different combinations and sub-combinations of the representative embodiments within the broad framework presented in this written specification, may be apparent to those skilled in the art but not explicitly shown or described, should not be construed as precluded.

Vertical Cavity Surface Emitting Laser (VCSEL) emits radiation in a direction perpendicular to the substrate plane. The radiation emitted from a VCSEL is a substantially symmetric circular beam having a very low divergence (narrow beam emission). It is particularly suited for applying simple beam shaping elements such as various types of ordinarily available lenses to further control the emission pattern at a relatively low cost (unlike most commonly used edge emitting diode laser). Furthermore, beam shaping elements may be applied to individual VCSEL externally or integrated, or to an entire group or subgroup of VCSELs when configured in a group, cluster or arrays.

In addition, the radiation is in a very narrow wavelength band and emission wavelength is practically independent of changes in operating temperature (unlike most commonly used edge emitting diode laser). Since the cavity length of a VCSEL is short, electrical parasitic elements are quite low. Therefore a VCSEL is extremely suited for driving with very short electrical drive current pulses that generates a very short pulse of radiation. Typical rise time of about 100 ps or less, allows modulation of VCSEL drive current at 10 GHz or more.

In contrast, a conventional diode laser is an edge emitting device that emits laser radiation from the edge of the substrate in a plane substantially parallel to the substrate plane. The fundamental mode has an elliptic shape thereby requiring more complex optical elements for beam shaping. Furthermore, each individual laser diode requires a separate temperature stabilizing means to control emission wavelength. One consequence of this particular aspect is that the laser diodes are not suitable to be placed in very close proximity of each other. While multiple laser diodes are configured in a linear array or a laser diode bar, they are not particularly suited to be configured in a two-dimensional group, cluster or an array. Beam shaping optical components certainly cannot be applied collectively or integrated with a laser diode bar that is most commonly used as an array of optical source.

Before describing optical sources for the 3-D sensing, imaging and scanning application a description of different types of VCSEL suitable for configuring these optical sources will be presented. A more complete description of VCSEL is provided in the U.S. Pat. No. 8,675,706 issued on Mar. 18, 2014, and in now allowed U.S. patent application Ser. No. 13/783,172 filed on Mar. 1, 2013, by some of the inventors of this application and co-owned by Princeton Optronics Inc., Mercerville, N.J., also Assignee of this application, content of which are being incorporated by reference in its entirety.

Referring now to FIG. 1, a typical and most commonly known two reflector self-lasing VCSEL is shown in FIG. 1a in a top-emission configuration (to be explained shortly). It is constructed in a vertically upward direction (in the context of FIG. 1a) perpendicular to a plane of a substrate 101. The basic device includes a first electrical contact layer 102 that also serves as a first electrical terminal, a light emitting region 104 which is a semiconductor gain medium disposed between two reflectors 103 and 106, and a second electrical contact layer 107 (also a second terminal) formed on a surface opposite to that of the substrate contact 102.

A current confinement aperture 105 controls the flow of drive current to the light emitting region and also determines the shape of emission beam, as has been described in the co-authored and co-owned pending U.S. patent application Ser. No. 13/337,098 by Seurin et al., filed on Dec. 24, 2011, the content of which is being incorporated by reference in its entirety. A transparent window 108 aligned with the current confinement aperture is provided on the VCSEL emission surface for the laser output 109 to be emitted in a direction perpendicular to the plane of the substrate (in the vertical direction in this particular illustration).

The conventions adopted here only for the purpose of illustration and ease of description, should not construed to be limiting. For the purpose of discussion following convention would be adopted—reference to a 'top' and 'bottom' ends or a 'top' and 'bottom' electrical contacts of the device is in reference to an emission surface. Accordingly, the emission end and the electrical contact on the top end of a device would be referred as the top end and the top contact, respectively. The non-emission end of the device and the electrical contact to the non-emission end would be referred as the bottom end and the bottom contact, respectively in the exemplary embodiments throughout, unless stated otherwise.

Figure 2:
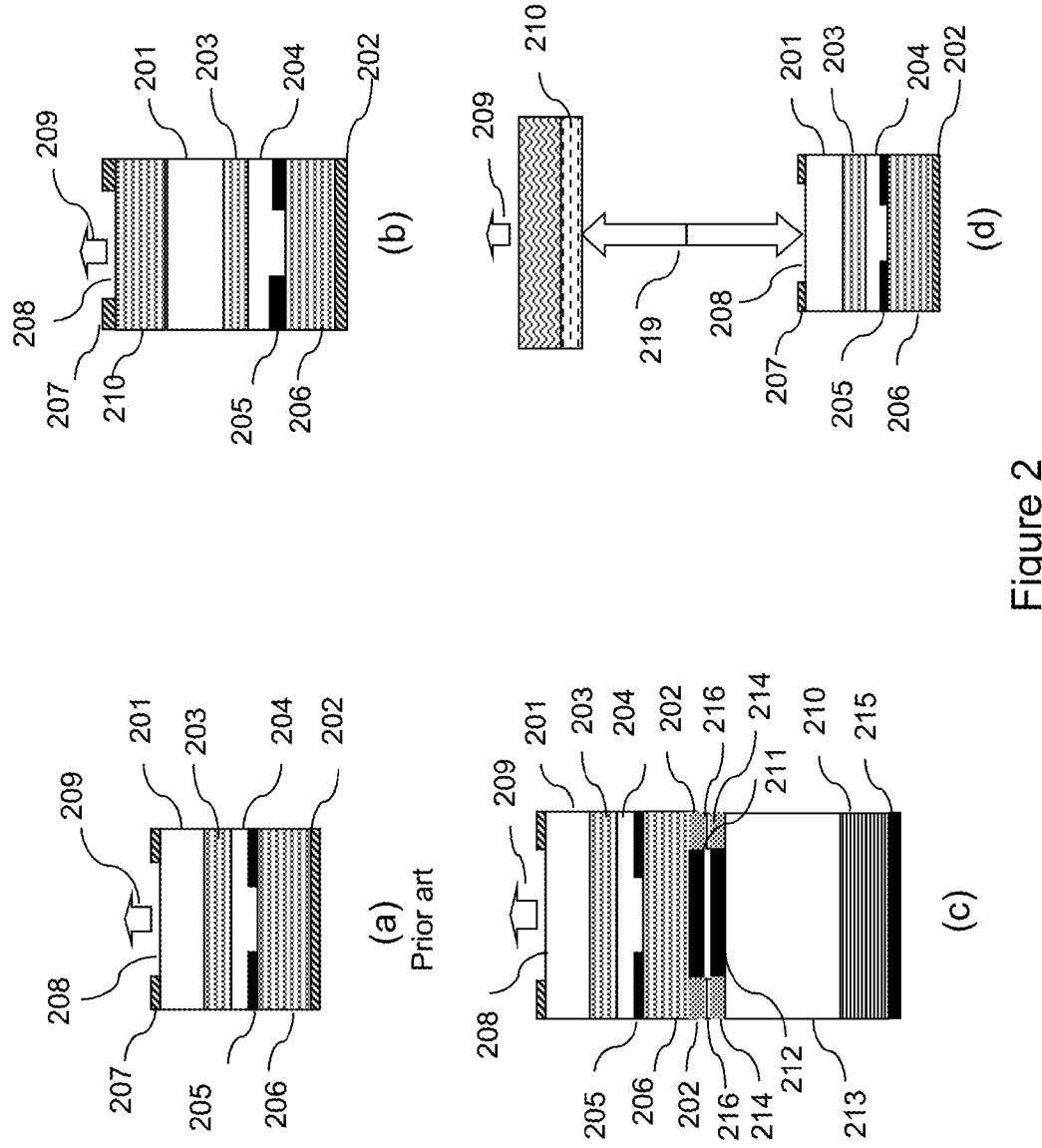
FIG. 2 shows a VCSEL devices configured in a bottom-emitting mode, (a) self-emitting two reflector VCSEL, (b) integrated extended cavity three reflector VCSEL, (c) extended cavity three reflector VCSEL with third reflector bonded to the device, and (d) extended cavity three reflector VCSEL with external third reflector.

Accordingly, the top emission device shown in FIG. 1a has the emission surface 108 located opposite to the substrate end and the VCSEL emission 109 is from a window above the light emitting region 104. Comparable performance is achieved in a counterpart bottom emitting device shown in FIG. 2. More specifically, a conventional prior art two terminal bottom emitting VCSEL is shown in FIG. 2a and described in the U.S. Pat. No. 8,675,706 issued on Mar. 18, 2014, and in now allowed U.S. patent application Ser. No. 13/783,172 filed on Mar. 1, 2013, which issued as U.S. Pat. No. 8,824,519 on Sep. 2, 2014, to some of the inventors of this application and co-owned by Princeton Optronics Inc., Mercerville, N.J., also Assignee of this application, content of which applications is being incorporated by reference in its entirety.

In FIG. 2a, elements that are identical or have the same function as in the top-emitting device shown in FIG. 1a are labeled with similar reference numeral (for example 101 & 201, and so forth). In a bottom emitting device, the emission surface is located on the substrate side of the device. Accordingly, the top and bottom contacts are located on the substrate end and at the active layer end, respectively. It should be noted that the bottom emitting device is typically mounted with the substrate side up, such that the light emission in the device is still in an upward direction (with respect to the plane of the substrate in this illustration).

While conventional devices shown in FIGS. 1a and 2a are adequate for applying in a 3-D imaging apparatus, particularly for low power applications, these devices are not the most preferred choice to achieve more desirable output characteristics for example, higher output power in a single mode, and better wavelength stability (with temperature over longer operation), just to name a few. Improved VCSEL emission characteristics may be achieved by extending the cavity length of a VCSEL (by way of example and not as a limitation, the vertical height in the illustration of FIGS. 1 and 2). In these devices an additional third reflector is deployed to achieve some of the desirable characteristics mentioned earlier. This can be achieved in different forms.

For illustrative purposes three different examples are shown in FIGS. 1b-1d. Although the exemplary devices are described in reference with top-emitting configurations shown in FIGS. 1b-1d for ease and clarity of discussion, same description is pertinent to equivalent bottom emission configurations shown in FIGS. 2b-2d as well, unless specified otherwise. Elements that are identical or provide equivalent functionality are labeled with substantially reference numerals in FIGS. 1a-1d and 2a-2d for the ease of description and brevity.

More specifically, FIG. 1b shows an exemplary top emitting VCSEL having three reflectors that are all integrated monolithically. The device constructed on a substrate 101 has a light emitting region 104 disposed between a first reflector 103 and a second reflector 106. The reflector 106 in this device is made to be partially reflecting and a third reflector 110 is fabricated on the bottom surface of the substrate opposite to the surface with the light emitting region. The reflectors 106 and 110 when designed with specific phase relationship, results in high reflectivity such that the combination, together with the reflector 103 provides desired lasing operation. Electrical contact to the substrate is made through the third reflector 110. Similar to the prior art device shown in FIG. 1a, the output 109 is still transmitted out of the reflector 103 in this exemplary configuration.

In a variant exemplary embodiment of an extended cavity VCSEL shown in FIG. 1c, a top emitting VCSEL is constructed on a substrate 101 has a light emitting region 104 disposed between 103 and 106 reflectors. Unlike the device described in reference with FIG. 1a, the reflector 103 which is made to be partially reflective in this embodiment forms the middle reflector and a third reflector 110 is included to configure an extended cavity device. The substrate 101 has a selective antireflection coating 111 applied to the surface opposite to the light emitting region 104. More specifically, the antireflection coating is applied in regions where the optical beam traverses between the reflectors 103 and 110. A metalized contact 102 is formed at the bottom in the regions not covered with the antireflection coating.

An extended cavity is formed between the reflector 106 and the third reflector 110 which is deposited on a transparent substrate 113 and has an antireflection coating 112 applied to one surface while the opposite surface is coated with a metal layer 115 to facilitate bonding to a heat sink. The surface of the transparent substrate including the antireflection coating has metallization 114 applied to the areas outside the region where the optical beam traverses. The third reflector 110 is located below the bottom surface of the VCSEL at design distance, determined by the thicknesses of the VCSEL and transparent substrates 101 and 113, such that the combined phase matched reflection from the reflectors 103 and 110 provide a high reflectivity to produce laser action having the desired output characteristics including, high output power in single mode, better wavelength stability and uniform beam shape.

The third reflector on the transparent substrate is attached to the substrate 101 preferably using a bonding method that may include metal-metal bonding, at the surface having the antireflection coating 111, using a solder 116 to form a monolithic module. Other suitable bonding methods include epoxy bonding or anodic bonding etc. that are well known and may be applied according to the desired end application requirements. The resonant laser action occurs in the cavity formed by the three reflectors 110, 103 and 106. The laser output light 109 emits from the reflector 106. The reflectors can be of various types such as distributed Bragg gratings, including dielectric or semiconductor, gratings including semiconductor, dielectric or metal, or reflecting metal.

In a different embodiment of the invention an extended cavity VCSEL may also be configured using an external reflector as shown in FIG. 1d. In this embodiment the basic device is very similar to a prior art device shown in FIG. 1a. More specifically, the VCSEL comprises a substrate 101 on which a light emitting region 104 is disposed between two reflectors 103 and 106, respectively. Reflectivity of the reflector 106 is substantially reduced such that an external third reflector 110 having a pre-determined reflectivity is positioned at a pre-determined height above the reflector 106. In particular, the third reflector is placed above the VCSEL emission window 108 such that the combined phase matched reflectivity of the reflectors 106 and 110 is high enough to provide laser output 119 in the cavity formed by reflectors 103, 106 and 110. The output 109 of the laser is emitted from the third reflector from a surface 111 that is opposite to the surface facing the VCSEL.

Basic principle of an extended cavity bottom emitting device is similar to the top-emitting counterpart shown in FIGS. 1b-1d. To configure an extended cavity 'bottom emitting' VCSEL shown in FIGS. 2b-2d, the reflector 203 is made with a lower reflectivity and placed between the reflector 206 and the third reflector 210, respectively. Reflectivity and position of the third reflector with respect to the reflector 203 is determined such that the phase matched reflectivity from the combination of reflectors 206, 203 and 210 provides lasing in the VCSEL cavity. More specifically, in the embodiment shown in FIG. 2b, the third reflector 210 is integrated with the substrate 201.

In the alternative embodiment shown in FIG. 2c, the third reflector 210 is constructed on a transparent substrate 213 and the transparent substrate is bonded to the bottom emitting VCSEL device substantially in a manner described in reference with FIG. 1c to construct a monolithic combination. That description will not be repeated. In the embodiment shown in FIG. 2d, the third reflector 210 is placed external to the VCSEL device. It will be apparent to those skilled in the art that in the embodiments shown in FIGS. 2b-2d, the laser emission is through a window 208 in the VCSEL substrate 201.

Although devices in FIGS. 1a-1d and 2a-2d are shown with the substrate 101 and 201, respectively, it is a common practice to reduce the thickness of the substrate, or completely remove the substrate in some applications, for efficient heat dissipation or to minimize absorption of the emitted light back into the substrate. One advantage of the devices described in reference with FIGS. 1 and 2 is that the VCSELs have planar contacts that do not use an external wire bonding. As an advantage, whole assembly can be constructed at a wafer level to produce and test a large number of modules on the wafer and then the completed modules are separated out by dicing without having to connect individual devices externally to individual contact pads. Furthermore, the VCSELs described here are readily adoptable for surface mounting, for example, on a surface mountable submount, a printed circuit board (PCB) with or without peripheral electronic circuits necessary to drive and control the VCSELs or to interface it with a controller and a processor such as a microprocessor, or a computer.

2-D Planar VCSEL Source

The accuracy of 3-D sensing, imaging and scanning apparatus requires an optical source having a low divergence and high output power. Individual VCSEL emitters while having low divergence and high speed operation capability do not provide very high output power necessary for illumination at a large distance from the source. In a preferred embodiment, an optical source having high output optical power necessary for very accurate 3-D sensing, imaging or scanning apparatus is constructed using a plurality of VCSEL devices configured in a 2-D planar form. In practice, a plurality of any type of VCSEL devices described in reference with FIGS. 1a-1d, 2a-2d may be monolithically integrated on a common substrate to construct a planar 2-D VCSEL array. It is noted that examples or preferred options that will be described in detail are only for illustrative purpose and should not be construed as limiting. For example, individual VCSEL devices may be bonded to a foreign substrate to construct a 2-D planar array. There are other choices for configuring individual VCSELs or VCSEL arrays on a common substrate or on a separate foreign substrate that are not specifically described here, but may occur to a person skilled in the art are not precluded from this description.

Figure 3:
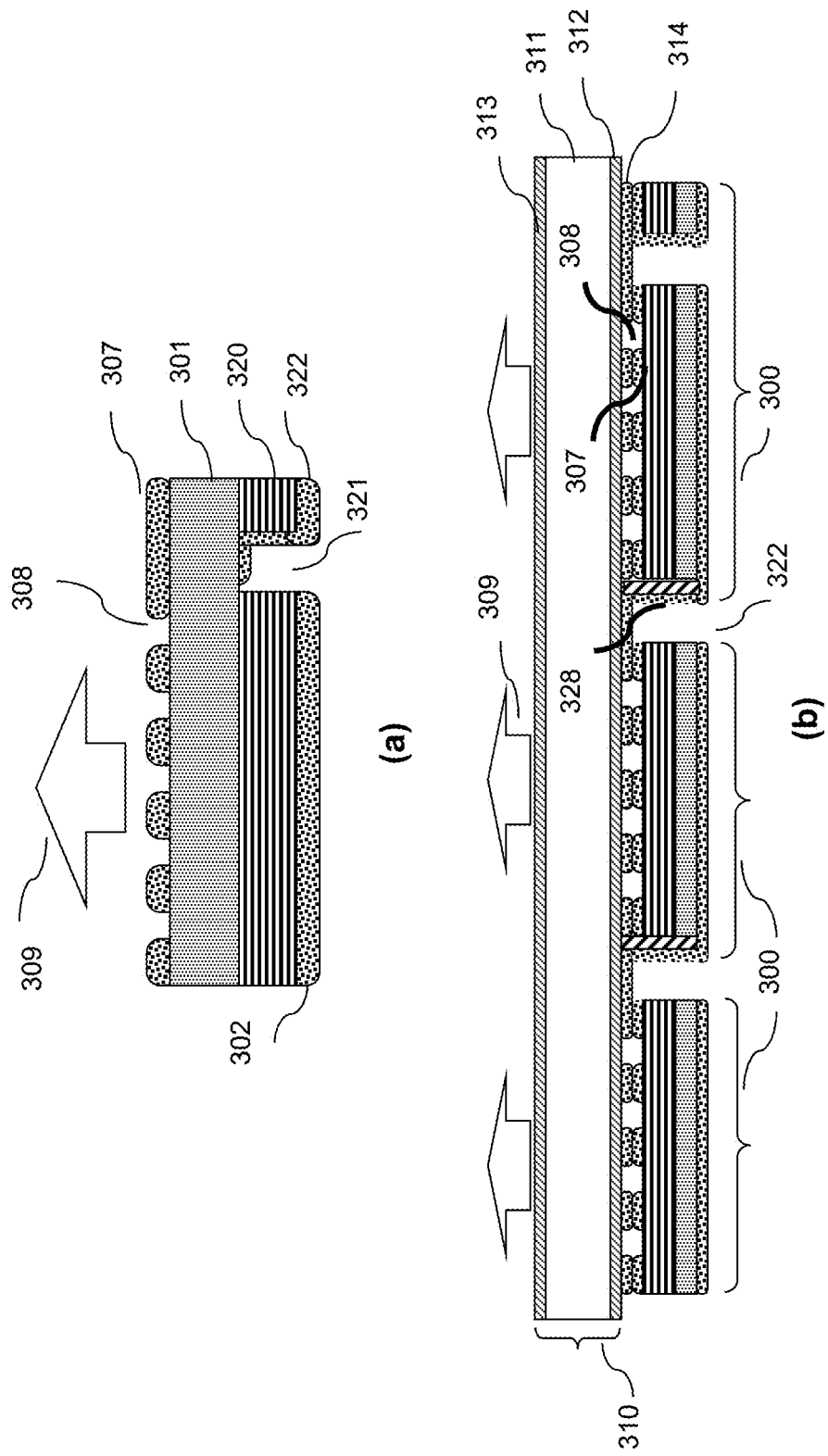
FIG. 3 shows a schematic cross section of a surface mountable monolithically integrated cluster/group/sub-array of a plurality of VCSELs, (a) a single array, and (b) an array of cluster/group/sub-array bonded to a common transparent substrate.

In the following description, as a matter of convention a 2-D planar VCSEL array implies a plurality of VCSEL devices arranged in groups, clusters, or arrays. A simple example of a regular array is shown in FIG. 3 and will be described in detail for illustrative purpose. A more detailed description of a VCSEL array may be found in the U.S. Pat. No. 8,675,706 issued on Mar. 18, 2014 to some of the inventors of this application and co-owned by Princeton Optronics Inc., Mercerville, N.J., also Assignee of this application.

While the example described here refers to a regular 2-D planar array, the description is equally pertinent to any 2-D planar arrangement of VCSELs in groups, clusters or any other 1, or 2-dimensional arrangement of individual VCSELs, whether distributed evenly or randomly (in terms of distance between adjacent VCSEL) within a group, cluster or array, or arranged to generate an illumination in a random or a regular geometric shape.

Furthermore, all VCSELs in an array need not be identical and different combinations determined by a particular type of illumination requirement may be used. In addition the spacing between the VCSELs can be the same to form a regular array pattern or different to place one or more groups of VCSELs in a random pattern to avoid 'aliasing' or Moiré effects that commonly occur with regular array patterns. The choice of a particular arrangement is governed by a desired illumination pattern (regular or random shape, uniform or non-uniform illumination, dense or sparse illumination, etc.) required for an area targeted for a particular 3-D sensing, imaging and scanning application. It is noted different arrangements that may occur to a person skilled in the art are within the broad framework of the invention.

Referring now to FIG. 3 and in particular to FIG. 3a, there it shows a two dimensional array (or a cluster) of a plurality of bottom emitting VCSELs, each represented as a window 308 (only one labeled for clarity) on a common substrate 301. The description is equally pertinent for any type of VCSEL described in reference with FIGS. 1a-1c and 2a-2c. All the VCSELs in the array are electrically connected on the active region side using a common metallization layer 302 which functions as a common first terminal of the array (for a bottom emitting case shown here). It must be understood that this is not the only way and common connection (terminal) may be made to the substrate side as well depending upon the device configurations described earlier (in reference with FIGS. 1a-1c and 2a-2c).

The second terminal of each VCSEL in an array may be configured in more than one way. For example, in order for the VCSELs to emit collectively, the second electrical contact of each VCSEL is connected in parallel using a common metallization 307 located on the emission side of the array (the substrate side in the example shown in FIG. 3a) where light is emitted through windows 308 (only one labeled for clarity) in the common metallization. Notably, one important aspect of the planar arrays constructed according to this invention is that the contacts to the array do not need external wire bonding. Those skilled in the art will be able to appreciate that reliability of these VCSEL arrays is substantially higher and in particular, for application where large optical power is required, as compared to conventionally assembled devices having external wire bonding. Wire bonding is another option, but is not particularly preferred or desired for 3-D sensing, imaging and scanning apparatus.

Figure 4:
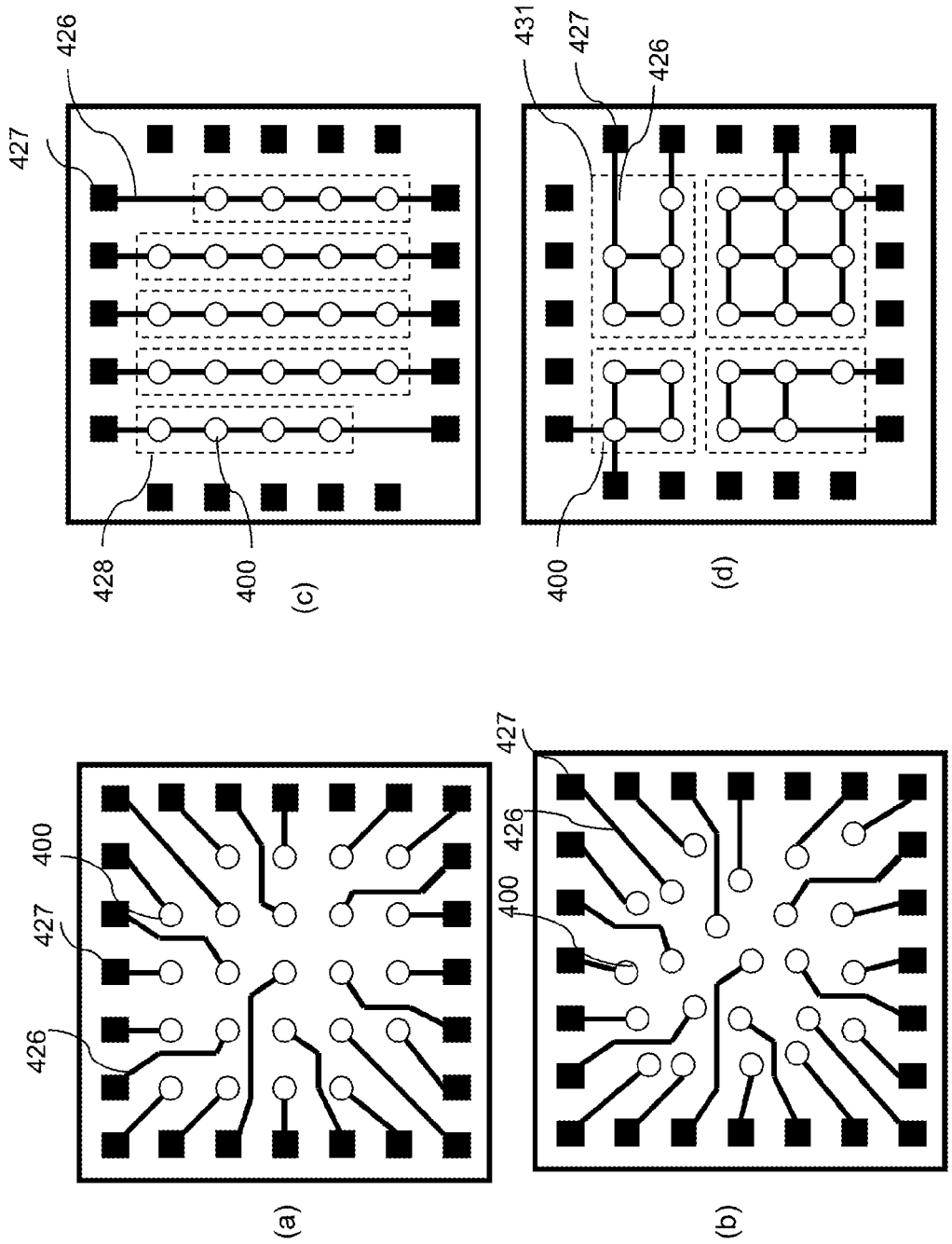
FIG. 4 shows electrical configuration to connect monolithically integrated VCSELs in a cluster, (a) individually addressable VCSELs located on a regular grid, (b) individually addressable VCSELs arranged randomly, (c) individually addressable linear sub-arrays of VCSELs, and (d); individually addressable two-dimensional sub-arrays of VCSELs.

VCSELs in an array may be electrically connected in one of many exemplary ways to apply drive current in a continuous (CW), quasi continuous (QCW), or pulsed operation. Electrical connections to VCSELs in an array are further determined by whether VCESLs in an array are to be addressed individually, collectively, in small groups, clusters, or arrays, in a fixed sequence, in a programmable mode, in a dynamically changeable mode or a combination thereof. For illustrative purpose, and not as limitation, a few representative examples of connecting VCESLs in an array are shown in FIG. 4. More specifically, in FIG. 4a, each VCSEL 400 (only one labeled for clarity) is provided with a separate conductor 426 and a corresponding bonding pad 427, respectively, such that individual VCSEL may be addressed separately, preferably in a programmable mode or in a pre-determined timed sequence.

Alternatively, a pre-determined number of VCSELs in a group may be addressed together, or a pre-determined number of groups may be addressed separately in a programmable mode or in a pre-determined timed sequence, to generate a structured illumination for example in a 3-D imaging and scanning apparatus. It is noted that the individual VCSEL may be positioned in a regular array pattern (FIG. 4a) or randomly (FIG. 4b). Furthermore, each VCSEL may be operated in a regular sequence or in a random sequence. These and other variations that may be apparent to those skilled in the art, fall within the broad framework of the VCSEL arrays constructed according to this invention.

Other alternative modes of operating VCSELs are shown in FIGS. 4c and 4d by way of example and not as a limitation. More specifically, FIG. 4c shows an arrangement where a group of VCSELs 400 (only one labeled for clarity) are configured in linear sub-arrays 428 (only one sub-array of the larger array is labeled for clarity) where individual devices in each linear sub-array are electrically connected together. Thus each linear sub-array is addressed via a respective common bonding pad 427 (only one labeled for clarity). In an alternative mode shown in FIG. 4d, individual VCSELs are connected in two-dimensional sub-arrays 431 (only one labeled for clarity), each array being addressable independently using a common bonding pad. It can be appreciated that the sub-arrays may be of any size or shape to achieve a desired illumination pattern required for an area to be illuminated.

The VCSEL arrays (including groups, clusters or arrays of plurality of VCSELs) described in reference with FIGS. 3 and 4 are building blocks for configuring larger arrays to obtain higher output power optical source. In one example shown in FIG. 3b, a larger array including a plurality of VCSEL arrays 300 preferably monolithic on a common substrate (not labeled here), is constructed on a transparent substrate 311. Individual VCSEL arrays (300) may be substantially similar to the one shown in FIG. 3a, or one or more VCSEL arrays in the larger array may be different. In this configuration of an array of arrays, each VCSEL array (300) may also be operated as an independent source of emission that may be activated separately or collectively in a programmable mode. The transparent substrate 311 has antireflection coatings 312 and 313 on opposing surfaces. The transparent substrate further includes a metallization layer having windows that match the windows 308 (only one labeled for clarity) on the VCSEL arrays The bonding between the VCSEL arrays and the transparent substrate is achieved through a metal-to-metal contact (307 and 314, respectively). More detail description may be found in the U.S. Pat. No. 8,675,706 issued on Mar. 18, 2014 to some of the inventors of this application and co-owned by Princeton Optronics Inc., Mercerville, N.J., also Assignee of this application. It should be understood that instead of a common transparent substrate, another suitable substrate for example, a semiconductor substrate (monolithically integrated or bonded with the VCSELs), a thermal submount, a PCB etc., may alternatively be used without deviating from the broad framework of the invention.

Figure 5:
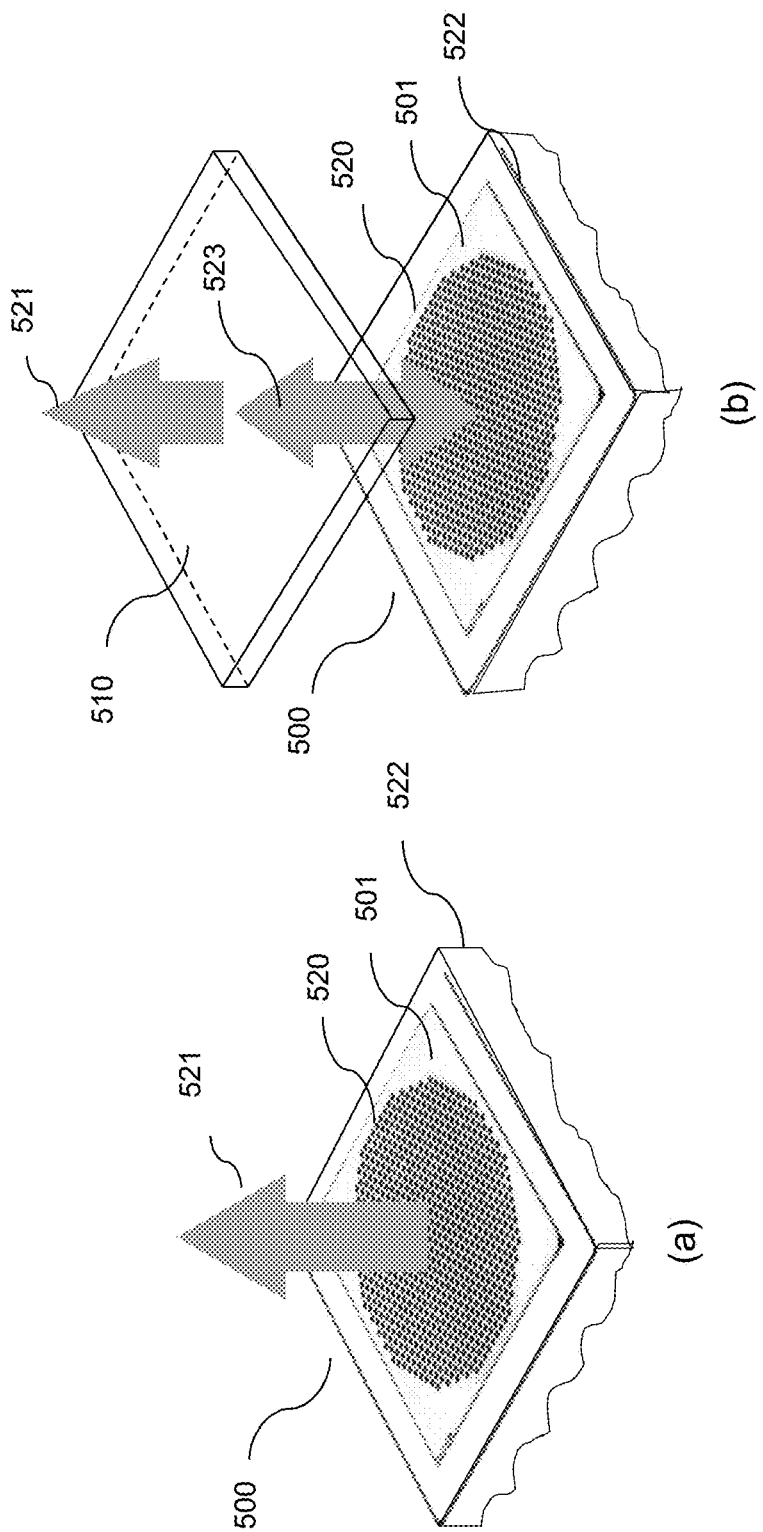
FIG. 5 represents a monolithically integrated VCSEL array chip configured with, (a) self-emitting, and extended cavity VCSELs with integrated or bonded third reflector, and (b) extended cavity VCSELs with external third reflector.

One preferred configuration most suitable for high output power optical source for 3-D sensing, imaging or scanning environment is a VCSEL array chip (or an array chip hereinafter). Any type of VCSEL device described in reference with FIGS. 1a-1d and 2a-2d may be used in this adaptation. Depending upon a particular application and power requirement, an array chip may include a single large size VCSEL array or a multiplicity of VCESL arrays (as shown in FIG. 3b) electrically connected to emit collectively as shown in FIG. 5. However, each VCSEL array in an array chip may also be configured to operate as an independent source that may be activated separately or collectively in a programmable mode as will be described later. The number of VCSEL arrays in an array chip and their individual emission properties are selected according to the required output power, shape, and size of the illumination area required for a given sensing, imaging or scanning environment.

More specifically, an array chip 500 shown in FIG. 5a includes a VCSEL array 520 grown on a substrate 501. All the VCSEL arrays emit collectively shown by an upward arrow 521 in this particular example. The array chip is mounted on a thermal submount 522 that is described in more detail in the co-authored and co-owned pending U.S. patent application Ser. No. 13/337,098 by Seurin et al., filed on Dec. 24, 2011. Content of the above mentioned application is being incorporated by reference in its entirety. In an alternative arrangement, the VCSEL arrays in an array chip may also be electrically connected to emit in groups or clusters such that different areas of the array chip may be operated according to a desired sequence or shape of illumination pattern or in accordance with a particular 3-D sensing, imaging and scanning requirement, or may be in a dynamically alterable illumination mode.

While this particular example shows a circular pattern, it can be well appreciated that the array chip may be configured to emit in other regular geometric or random shapes. In addition the spacing between the VCSEL arrays in the array chip can be the same to form a regular array pattern or different to place one or more groups of VCSEL arrays in a random pattern to avoid 'aliasing' or Moiré effects that commonly occur with regular array patterns. It is noted that the packing density of VCSEL arrays in the array chip need not be the same on the entire surface. For example, VCSEL arrays may be packed more densely in certain areas for providing a higher image resolution, as compared to areas where a lesser degree of image resolution is needed.

The same concept of an array chip may be applied to an extended cavity three reflector VCSEL devices using an external third reflector as shown in FIG. 5b. The array chip 520 is substantially similar to that shown in FIG. 5a except that a separate external reflector 510 (similar to the third reflector in FIGS. 1d and 2d) is positioned at a pre-determined distance above the substrate 501 such that the combined cavity comprising the three reflectors produces laser action 523 in each VCSEL with the desired characteristics. The output beam 521 is transmitted out from the array chip in the upward direction (in this particular example) from the external reflector surface distal to the substrate. One advantage of this configuration is that a single external reflector is sufficient for the entire optical illuminator module.

It can be well appreciated that the optical sources for 3-D imaging apparatus constructed using VCSELs according to this invention offers a wide range of design options that are not available with other prior art optical sources. For example, an area to be illuminated may be dynamically altered by programming a smaller section of an array to be illuminated at a time, or different sections of an array illuminated in a pre-determined sequence. Similarly, shapes of illumination pattern may be dynamically reconfigured by simply programming a desired drive current sequence to arrays in a specific region of the array chip. It can be further appreciated that an optical source configured according to this invention would be easily adaptable to reconfigure illumination pattern in a 3-D imaging apparatus without having to change the source. Many combination and sub-combination of operating sequence may occur to those skilled in the art for different application. This aspect of the invention is particularly suitable for portable 3-D imaging device for field application.

Figure 6:
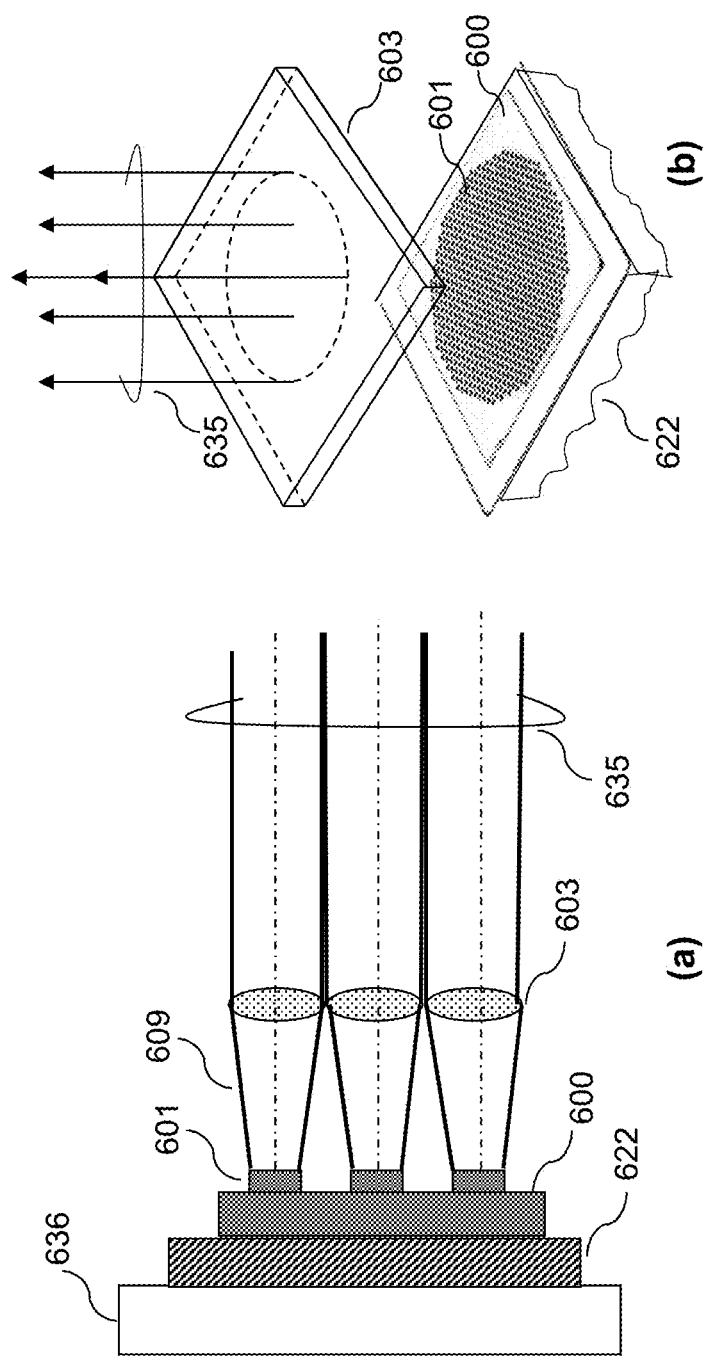
FIG. 6 represents a preferred beam shaping scheme that results in a highly collimated narrow beam of light configured to generate a uniform illumination pattern by overlapping individual narrow beams, (a) cross section view and (b) planar view.

It is known that emission from single VCSEL is narrow. Emission from a VCSEL may be collimated to a narrow beam with relative ease using additional simple optical components to facilitate beam shaping. Beam shaping may be achieved for individual VCSELs in an array, collectively to a group, cluster, or array of VCSELs, or the entire array chip. Referring now to an embodiment shown in FIG. 6, one option for beam shaping is to use an array of microlenses to collimate output beams from individual VCSEL array (a group, cluster or array) of the array chip. FIGS. 6a and 6b represent a cross section and a planar view, respectively. More specifically, a VCSEL array 601 and an array of microlens lenses 603 are designed and fabricated so that the individual microlens and VCSEL arrays are aligned on respective common axes. Notably, as a design option the VCSEL arrays may be individually constructed or monolithically integrated in an array chip.

The array chip on a common substrate 600 is placed on submount 622 and the entire assembly is mounted on a heat sink 636 for effective cooling of VCSEL elements. The microlens array is aligned and positioned at a pre-determined distance from the VCSEL arrays (or the array chip) so that the diverging beams 609 (only one labeled for clarity) from the VCSEL arrays are formed into a group of collimated beams 635 with the same array configuration and form factor as the VCSEL elements and microlens. The resulting combined output beam has a much lower divergence than the original output beams from the VCSEL array and provides a quasi-uniform intensity at sufficiently large distance away from the VCSEL array or the array chip.

Figure 7:
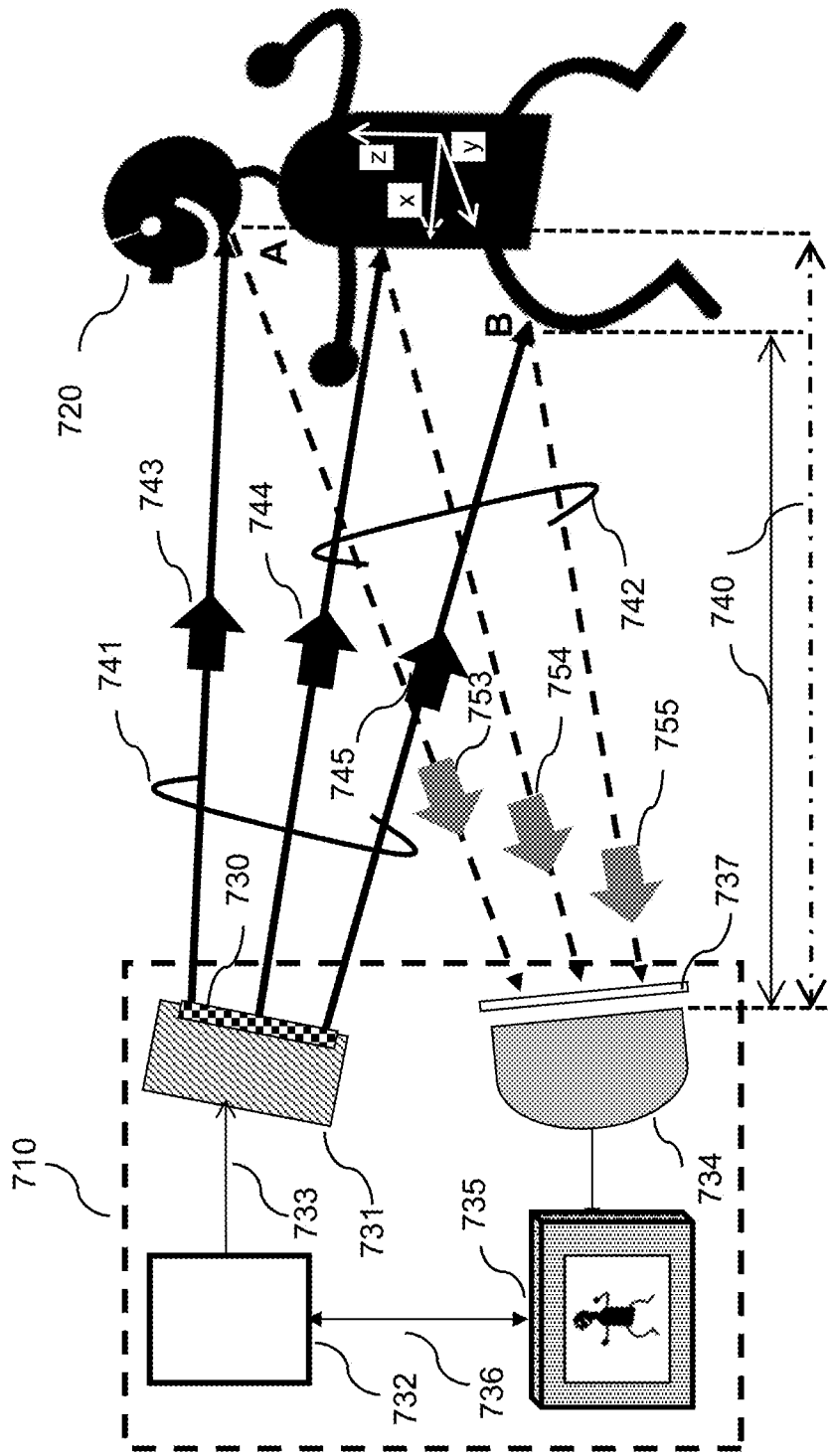
FIG. 7 is an exemplary configuration of a 3-D proximity sensing system having a VCSEL optical source for illumination.

Proximity/Distance Sensing and Measurement:

It is recalled that a VCSEL array chip particularly configured in a two dimensional planar array in its various forms described in the previous section, is readily adaptable as an optical illumination source for a 3-D proximity (synonymously used as distance in this context) sensing and imaging apparatus. An array chip is preferred due to superior emission properties such as, highly collimated (low divergence) beam even at a relatively large distances, relatively high output power and high speed driving capability to generate very short radiation pulses and its ease for dynamic adaptability over other prior art light sources such as, LEDs, array of LEDs, edge emitting laser diodes, laser diode bar that are more widely used. FIG. 7 shows a schematic representation of an apparatus where an optical source comprising a VCESL array chip can be practiced for proximity sensing both qualitatively and quantitatively (measuring the distance of an object still or moving from a reference point).

More specifically, major components of the apparatus are schematically shown within a box 710. The schematic shown here is a simplified view to illustrate the concept of 3-D sensing and imaging application using a 2-D planar VCSEL source described earlier. It should be noted that this illustration is in no way limited to the specific arrangement shown here. The basic apparatus shown here may be used in different modes that will be described shortly. In general, an optical source 730 preferably a 2-D planar VCSEL source comprising a VCSEL array chip (including one or more VCSEL arrays) is used for illuminating an object (a subject, a moving target, etc.) or a region of interest. The array chip is mounted on a thermal submount 731 for external cooling of the optical source.

A programmable current driver 732 generating a drive current 733 activates the illumination source in one or more preferred mode of operation for example, that include driving the entire array chip collectively, in a programmable mode, or as individually addressable VCSEL arrays where the array chip comprises a plurality of VCSEL arrays (similar to the one shown in FIG. 3b, for example). Radiation emanating from the optical source collectively shown as 741 using solid arrows incident upon an object 720 is reflected off of the object which is collectively shown as 742 using dashed arrows. It is noted that although incident and reflected radiation is represented by few arrows, in practice all radiation incident on and reflected from a solid object may actually be combined in one solid beam or cone of radiation. While some part of the incident radiation may be scattered depending upon the surface features of the object, a significant part of the incident radiation is reflected.

A receiver 734 is placed at a pre-determined angle with the optical source to detect the reflected radiation. The receiver may be in the form of an analog or a digital camera, a charge couple device (CCD), array of photodetectors, or any other receiver that may be operated in the wavelength of incident radiation including visible and infra-red wavelengths. For simplicity, the optical source and the receiver are shown in the same vertical plane, but that is not the only option. The optical source and the receiver may be arranged in the same horizontal plane or any other relative positions determined according to other considerations for example, size, form factor, viewing area, etc.

A processor 735 receives a signal proportional to the received reflected radiation. In one embodiment of the invention, the programmable current driver and the processor may be combined in an instrument having a microprocessor and a memory device to provided control, measurement, analog or/and digital signal processing (ASP/DSP) and data analysis and data storage capabilities. The input to the processor may be entered from external interfaces of the instrument or may be pre-programmed in the internal memory. In a variant embodiment, the instrument may also include the programmable current driver and signal receivers that may be interfaced with a computer to provide control, measurement, ASP/DSP and data analysis and data storage functions. These variations are well known to those skilled in the art and any other instrument with similar functionality may be applied.

It can certainly be appreciated that depending upon the distance of the object from the source of radiation, ambient or stray background radiation may be comparable to, or even higher than the reflected radiation received at the detector which would manifest as poor optical signal to noise ratio (OSNR). One advantage of low divergence properties of VCSEL radiation is that a high intensity illumination is maintained on the object even at relatively large distances between the object and the radiation source. Furthermore, VCSEL radiation is emitted in a very narrow wavelength band. Therefore, reducing ambient radiation is achieved relatively easily by placing an optional optical filter 737 having a pass band matching with the wavelength of the VCSEL radiation. This improves OSNR by blocking practically all of the ambient background light from falling on the detector.

The basic apparatus described above may be used in many different modes for proximity sensing and distance measurement. In one preferred, and the simplest mode of operation, the current driver is programmed to drive all the VCSELs in the array chip simultaneously to generate a uniform illumination over an area of interest. The intensity of the incident radiation is determined in the processor by using signal 736 comprising drive current information and one or more properties of VCSELs in the array chip. Any object present within the illuminated area would reflect radiation and the intensity of reflected radiation would depend on the distance of the object (740) and/or surface features or textures that may scatter part of the radiation. In this mode the proximity sensing/measurement depends on the amount of radiation that is reflected off of the object.

The measured intensity of radiation received from different parts of the object or the entire object is compared with the incident intensity of the radiation (for example, a ratio between the reflected and incident intensities). For illustrative purposes, two points on the object for example, A and B, respectively, are located at two different distances from the optical source and receiver plane. Intensity of reflected radiation from point B (which is closer) would be higher than the intensity received from point A (which is relatively farther). Proximity of a specific part of the object or the entire object is determined in the processor by analyzing relative intensities (for example a ratio) of the incident and reflected radiation received from the object.

In a different mode of operation proximity sensing and measurement uses a timed sequence of the reflected radiation where high speed properties of the VCSEL has a significant advantage over other traditional optical sources mentioned earlier. More specifically, the current driver is programmed to drive all the VCSELs in the array chip in a pulsed mode to generate short incident radiation pulses. The short radiation pulses shown as bold arrows 743-745 from the optical source illuminates an area of interest in pre-determined timing sequence or at pre-determined timing intervals. Any object present within the area of illumination will reflect the incident radiation. Arrival time of the reflected radiation pulses 753-755 at the detector would be proportional to the round trip travel distance 740 to the object and back from the object to the detector, based on the speed of light in the measurement medium/environment. For this mode of operation the receiver is preferably a high speed photodetector or an array of high speed photodetectors capable of detecting short radiation pulses.

The detector in this mode of operation is set to record arrival time, pulse shape and intensity of the radiation pulses reflected off of the object. The reflected radiation pulses arrive at different times at the receiver front, depending upon respective distances of different parts of the object they are reflected from and the distance from the optical source and the receiver, respectively. The reflected radiation pulses are detected synchronously with a timing signal 736 that operates the current driver for generating the incident radiation pulses. In effect, the processor analyzes a time of flight (TOF) between the incident radiation pulse travelling to the object and the reflected radiation pulse back to the receiver, to determine the proximity of the object. Multiple proximity measurements may be used to generate a comprehensive set of data to accurately determine both lateral spatial distances (in x-z plane in reference with FIG. 7 in this example) and depth (along y axis) of different parts of an object or the entire object within an illuminated area of interest.

The optical source comprising a VCSEL array chip as described in this invention is particularly suited for pulse mode of operation because of fast pulse rise time of VCSEL radiation (approximately 1/10th nanosecond or less). Furthermore, optical power of the optical source comprising a VCSEL array chip may be quite high (several 10-100 watts or more). Therefore accurate proximity sensing is possible with resolutions of 1 inch (or 2.5 cm) or better at a distance of about 100 ft. when high sensitivity photodetectors are used as receiver. It is noted that the numbers quoted here are only exemplary and should not be construed to be limiting. Furthermore, additional information such as, size and surface properties of the object may be obtained by analyzing the intensity of the reflected radiation pulses because variations in object size and/or reflectivity will vary the intensity of the reflected radiation pulses.

Figure 8:
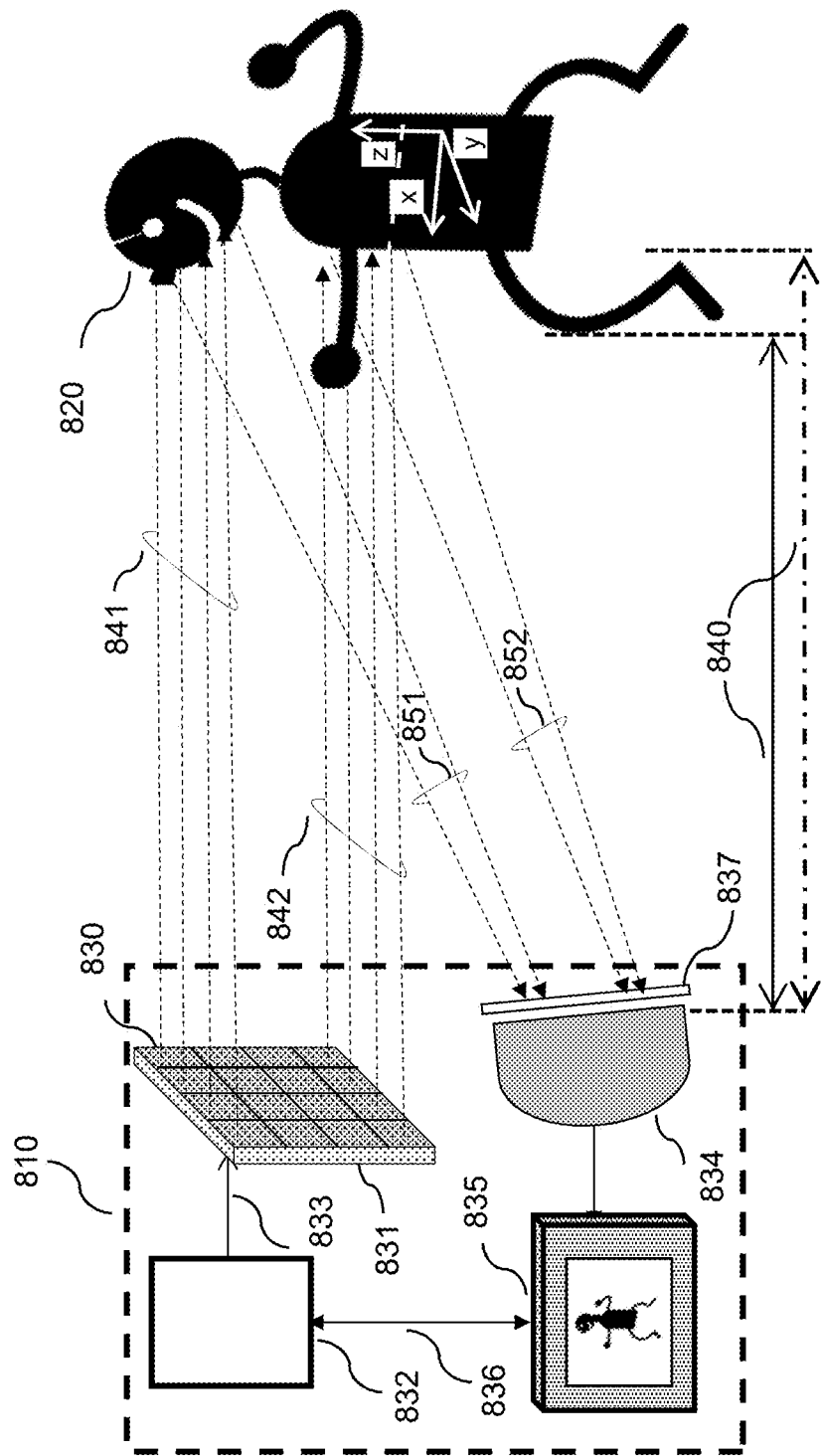
FIG. 8 shows an alternative configuration of a 3-D proximity sensing and imaging apparatus.

Three Dimensional Sensing and Imaging:

In a different embodiment of the invention shown in FIG. 8 the illumination pattern may be changed dynamically for measuring spatial information (in x-z plane with reference to this figure) as well as proximity or distance of objects (in y direction with reference to this figure). Basic elements of this embodiment is substantially similar to the one described in reference with FIG. 7 and elements that are identical or have similar function are labeled using equivalent reference numerals (710, and 810 and so forth). Description provided in reference with FIG. 7 is applicable for the apparatus shown in FIG. 8 as well. Therefore the description that is common in the two embodiments will not be repeated for brevity.

One important difference between the embodiments shown in FIGS. 7 and 8 is the optical source. Optical source comprising a VCSEL array chip 830 mounted on a thermal submount 831 includes a plurality of addressable VCSEL arrays substantially similar to those shown in FIG. 4. Referring now simultaneously to FIGS. 4 and 8, each square on the array chip grid may include one or more VCSEL arrays, each array configured preferably, in an addressable mode to operate each array either alone or in a pre-determined group for example, a group, cluster, a linear or two-dimensional sub-array described earlier in reference with FIG. 4. The number of VCSEL arrays and their placement in the array chip is governed by the area to be illuminated and need not always be arranged in a square pattern as shown in this example.

As described earlier in reference with FIG. 6, additional one or more optical components are easily integrated with VCSEL arrays for beam shaping individual VCSEL array, a group, cluster, or sub-arrays or entire array chip, if required by a particular application. Furthermore, some beam shaping optical components such as microlens or microlens arrays may optionally be integrated with the VCSEL arrays or the entire array chip. Beam shaping optical elements when combined with low divergence emission from VCSEL facilitate generation of a variety of illumination patterns to suit the specific sensing, imaging and scanning requirements.

In one mode of operation a programmable current driver 832 provides current pulses (833) to activate one or more VCSEL arrays in the array chip in a pre-determined sequence. A plurality of narrow beams of radiation is generated each to illuminate a different area of the object or a region of interest, one at a time. In the illustrative example shown in FIG. 8, a plurality of incident beams collectively shown as 841 (or 842, only two shown for clarity) is generated from the each row of VCSEL arrays of the array chip to illuminate a particular horizontal plane having the same 'z' coordinate. It is further noted that each beam in the group 841 would illuminate a different 'x' coordinate position in the same horizontal plane. The incident beams 841 (842) may be generated one at a time or all at once depending upon the resolution required in a particular application. In a substantially similar fashion, several sets of beams, each one in a different horizontal plane provide structured illumination in an area of interest following a pre-determined programming sequence.

It should be noted that the sequence or pattern of plurality of beams shown in FIG. 8 is only for illustrative purpose and other sequences may be adapted depending upon the illumination requirement to achieve a desired detection or image resolution in a particular application. It can be appreciated that the programming sequence may be altered dynamically to change resolution. For example, in a surveillance application, once a target is identified to be in the area of interest, imaging resolution may be increased for better accuracy in determining the distance of the object.

It can be easily visualized that an object located within the area of interest will be illuminated in different sections in a programmed sequence. Accordingly, radiation reflected off of the object collectively shown as 851 and 852 (only two groups shown for clarity) would be received at a receiver 834 placed in front of the object in a sequential manner. An optional optical filter 837 is placed in front of the receiver to improve the OSNR of the received signal by substantially blocking the background radiation reaching the receiver. The receiver is set to receive reflected radiation pulses.

The receiver is set to measure the time as well as the intensity of each received pulse reflected off of a different part of the object. Reflected pulses are received at different times depending upon the distance each reflected pulse traverses from the optical source to the object and from the object to the receiver. A time synchronization signal 836 is provided to the processor 835 from the current driver to synchronize received radiation pulses to the incident radiation pulses. The processor using the time synchronization of the incident and received pulses computes the lateral spatial position of the object where the pulse is reflected from (in x-z plane). The distance of the object where the pulse is reflected from (along y-axis), is determined by the arrival time and intensity of the reflected radiation pulse. The intensity of the reflected radiation pulses received different parts of the object at the receiver is used to compute an intensity profile of the object.

The embodiment shown in FIG. 8 may also be used in a time-of-flight (TOF) mode for 3-D sensing and imaging. The apparatus shown in FIG. 9 has substantially similar elements as in the apparatus shown in FIG. 8 and the same description applies. That description will not be repeated for brevity. In the TOF mode of operation low divergence and high speed properties of VCSELs are particularly useful. In operation the current driver is programmed to operate each VCSEL element in the optical source 930 with short current pulses to generate proportionally short radiation pulses 941 and 942 (only two shown for clarity). Typically, radiation pulses have a width of a few nanoseconds with a rise time of about 100 psec. (picosecond) to 1 nsec. (nanosecond) and fall time of about a few nanoseconds or more. Therefore, narrow beams radiation pulses may be generated in a pre-determined rapid sequence. Each narrow beam of radiation illuminates a different part of an object 920 or different objects within an area of interest, depending upon the application.

As has been described in reference with FIG. 8, each pulse in a group (e.g. 941) is set to scan the object in a lateral plane (in x-coordinate) at a particular height (z-coordinate). A receiver 934 comprising high speed photodetectors in this exemplary embodiment are set to measure arrival time and intensity of each radiation pulse reflected off of the object. The arrival time of reflected radiation pulses 951 and 952 (only two sets shown for clarity) at the detector is the sum of the time for the incident radiation pulse to travel to the object and the reflected radiation pulse to travel back to the receiver. Typically, a time-of-flight is measured synchronously with the driver current pulse that generates the incident radiation pulses. A signal 936 from the programmable current driver 937 is used for synchronization. Therefore a time-of-flight measured synchronously with the incident radiation pulses is proportional to the distance 940 of each part of the object taking into account the speed of light in the environment. For better accuracy, a set of TOF is measured in a pre-determined time interval.

In practice, the receiver receives a plurality of reflected pulses in a timed manner. It should be noted that there may be a series or group of reflected pulses from different parts of the object illuminated by the same VCSEL array at different times according to their respective distance from the optical source and the receiver. The processor 935 upon receiving reflected radiation pulses synchronizes the sequence of received pulses with the incident radiation pulses using a synchronization signal 936 from the programmable current driver. The processor determines the distance of different parts of the object by analyzing the TOF of the reflected pulse from the optical source to the object and traveling back to the receiver.

The processor computes distances traversed by each of the plurality of reflected pulses providing a comprehensive set of distances for different parts of the object or multiple objects in a region of interest. Furthermore, a lateral position (in x-z plane in this illustration) of a part of the object or multiple objects in a region of interest, may be computed by identifying the position of respective VCSEL elements in the grid illuminating a certain part of the region of interest, and using a time signature of that particular element to synchronize with the reflected radiation pulses. The intensity of the reflected radiation pulses received different parts of the object at the receiver is used to compute an intensity profile of the object. The intensity profile, lateral spatial distances and depth of different parts of the object can be combined with the sequence of the incident radiation data to compute a 3-D image of the object. A complete image may be constructed using image processing methods in the processor and may be displayed on a screen or stored for further image processing.

Figure 9:
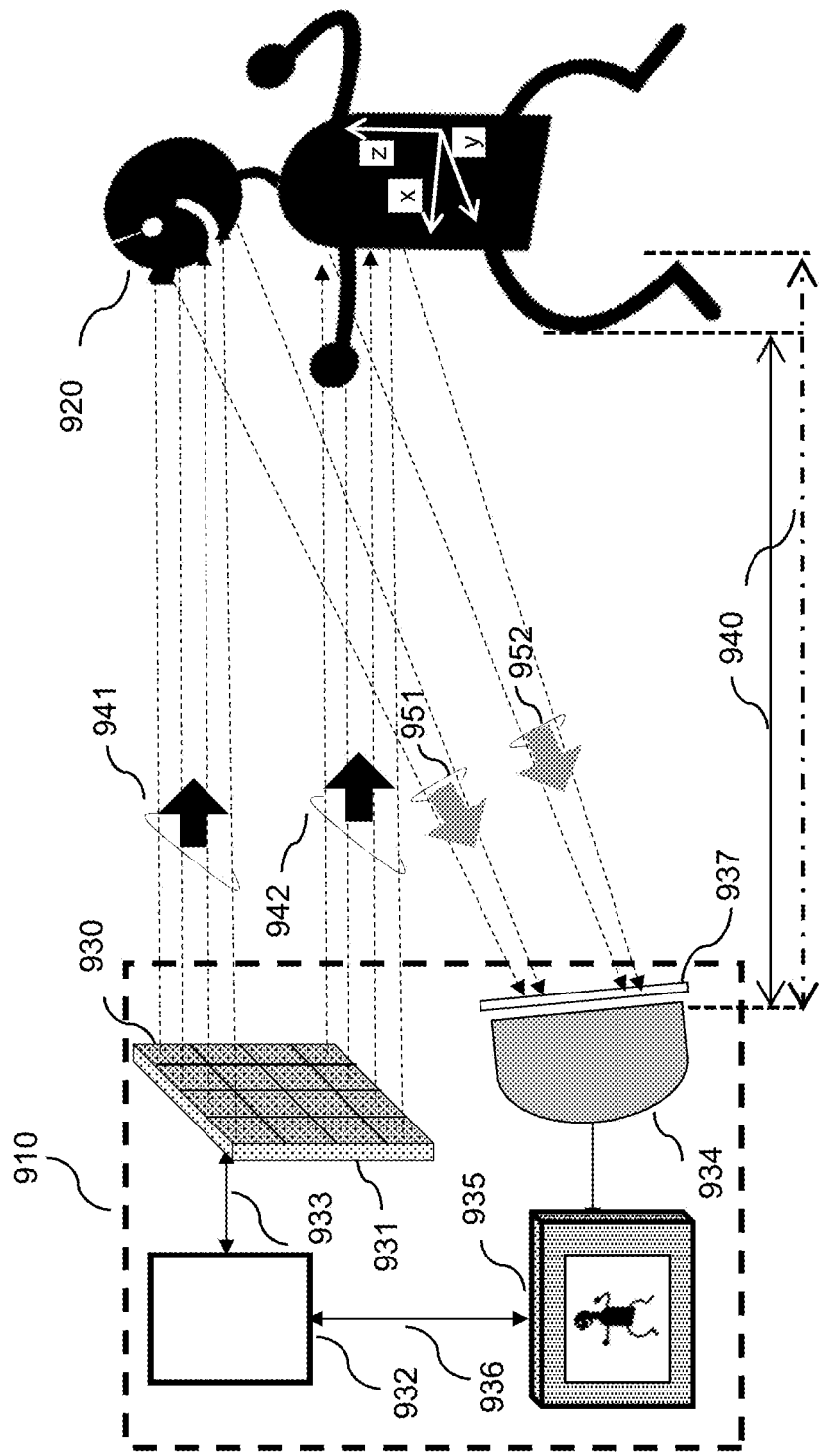
FIG. 9 shows an embodiment adopted for time of flight 3-D proximity sensing and imaging method.
Figure 10:
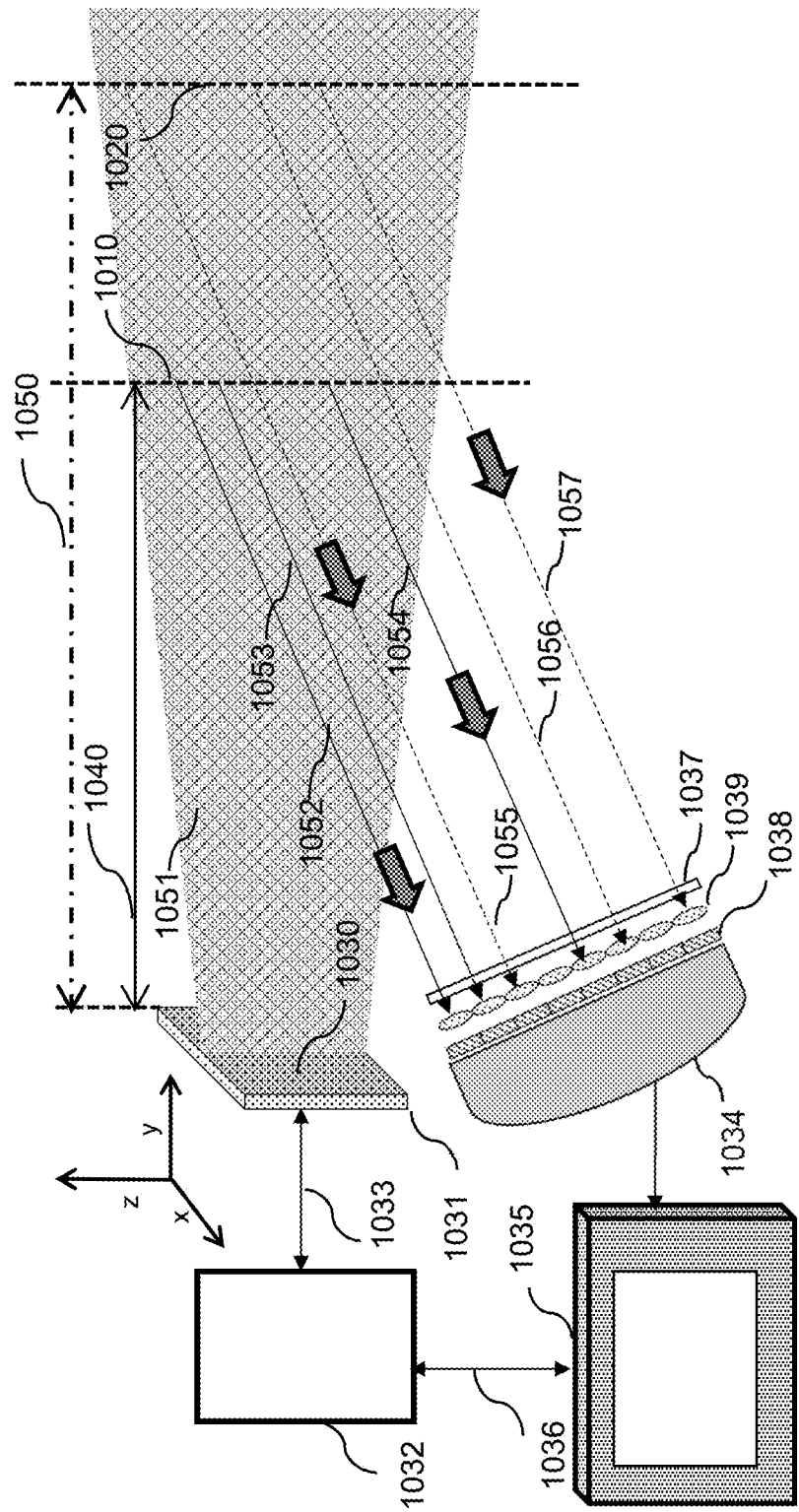
FIG. 10 shows an embodiment adopted for structured illumination/detection 3-D proximity sensing and imaging method.

In a different embodiment shown in FIG. 10 structured illumination described in reference with FIGS. 7, 8 and 9 may be combined with structured detection for better accuracy. Then basic components of this embodiment are substantially similar to the embodiments described in FIGS. 7, 8 and 9 and that description applies here as well. More specifically, an optical source 1030 comprising an array chip is mounted on a thermal submount 1031, substantially similar to the optical source described in reference with FIG. 7 to illuminate an area or a region. A current driver 1032 is programmed to provide drive current to the array chip in a pulsed mode to generate a sequence of radiation pulses that illuminate a broad region 1051 in front of the optical source (only a small cross section of the entire illuminated area is shown for clarity). Any object or parts of an object, present in the broad illumination region positioned at different distances (in y direction) or different lateral positions (in x-z plane in this illustration) would reflect the incident radiation in the forward direction as shown by solid arrows 1052-1054, and dashed arrows 1055-1057 originating from different planes 1010 and 1020 (only two shown for clarity), respectively located at different distances 1040 and 1050, for illustrative purpose.

The radiation receiver 1034 in this embodiment is different from the receiver described earlier. The receiver for this particular embodiment comprises a high speed digital camera or a plurality of high speed photodetctors arranged in random or regular array pattern (shown as 1038 for illustrative purpose). In front of the detectors is placed a microlens array 1039 such that each photodetector is registered with a corresponding microlens. An optional optical filter 1037 is placed in front of the microlens array to improve OSNR by blocking background radiation substantially. Each photodetector or each imaging element of the camera in conjunction with its corresponding microlens, images a narrow cross section view of the reflected radiation (1052-1054 or 1055-1057) from different parts of an object or different objects as the case may be.

It can be well appreciated that a plurality of reflected radiation pulses arrive at different times from each of the planes 1010 near to the receiver or the plane 1020 which is farther away. Similarly, reflected radiation pulses received from objects or different part of the object located at a different lateral position (in x-z plane in this illustration) would arrive at different times at the receiver. Each photodetector or camera element from its limited view of the illuminated region, records in a processor 1035 time of arrival, pulse shape and intensity of the plurality of reflected radiation pulses from different parts of an object or different objects.

The processor determines the distance of the objects 1040 or 1050 by analyzing TOF of the reflected radiation pulse (time to travel from the optical source travelling to the respective objects, reflected from the object and travelling to the receiver) synchronized with a signal 1036 received from the current driver 1032. By synchronizing the receiver data with the current driver timing information, the processor computes lateral positions from where each of the multiple reflected radiation pulses originate, and respective distances travelled by each of these multiple pulses in a comprehensive set of distances for multiple objects and/or parts of the object in the region.

Figure 11:
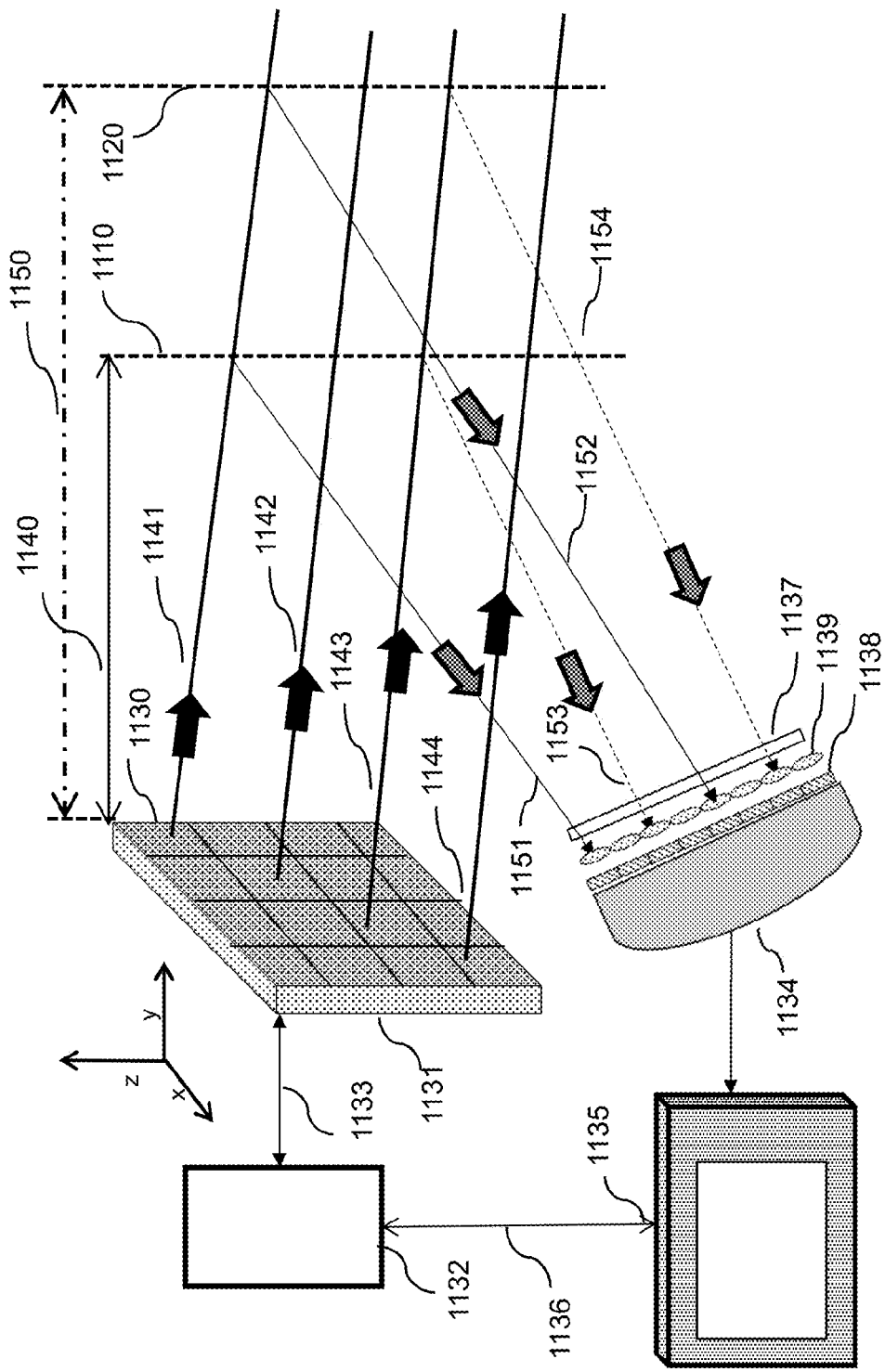
FIG. 11 shows an embodiment adopted for structured illumination/detection in conjunction with time of flight 3-D proximity sensing and imaging method.

The 3-D sensing and imaging may be further refined by combining the structured detection described in reference with FIG. 10 with structured illumination described in reference with FIGS. 8 and 9. A schematic representation of an embodiment combining the structured illumination and detection is shown in FIG. 11. Elements that are identical or provide similar function are labeled with similar reference numeral. Description provided earlier for structured illumination (FIGS. 8 & 9) and structured detection (FIG. 10) is applicable to the schematic shown in FIG. 11 and will not be repeated.

In operation, the programmable current driver 1132 is configured to drive each independently addressable VCSEL array in a pre-determined programmed sequence to generate narrow beams of radiation 1141-1144 (only few shown for clarity) in a pulse mode. Each of these beams illuminate different lateral parts (in x-z plane in this illustration) of objects 1110 and 1120 (shown only as vertical planes for clarity of illustration) located at different distance 1140 and 1150, respectively, within the region being illuminated. Additional optics (not shown here) may be disposed with the optical source to achieve illumination patterns to suit the specific imaging and sensing requirements.

The receiver 1134 is substantially similar to the receiver described earlier in reference with FIG. 10. The receiver comprises a plurality of camera imaging elements, preferably a digital camera, or photodetectors (1138 in this particular example) deployed with an array of microlens (1139), each microlens registered with a corresponding photodetector. The photodetectors or camera imaging elements may be arranged in a random or a regular array pattern. In a preferred apparatus, the receiver photodetctors is a mirror image of a pattern of the VCSEL elements. An optical filter 1137 is placed in front of the microlens array to improve OSNR by blocking essentially all of the background radiation reaching the detector. Each photodetector in conjunction with its corresponding microlens images only a narrow section of the reflected radiation in direct view of the region being illuminated.

Furthermore, the optical axis of the optical source is positioned at a pre-determined angle with the receiver such that incident radiation originating in a VCSEL element after reflected from a part of an object or different objects reaches a particular photodetector depending upon the distance of the part of the object of different objects. The plurality of reflected pulses arrive at the receiver at different times depending upon the location of the object they are reflected from. The receiver records arrival time, intensity and pulse shape of each reflected pulse in a processor. The processor synchronizes the arrival time of each reflected pulse using a timing signal 1136 from the current driver. The processor analyzes TOF in reference with the pre-programmed driving current sequence of each VCSEL element to determine distances and lateral positions of the parts of objects or different objects to compute a 3-D image.

Lightfield Optical Source:

One object of the invention is to extend the principles described earlier for 3-D sensing and imaging to provide a 3-D scanning apparatus using high output power and relatively compact optical sources described earlier for accurate distance measurement and high quality imaging. In a typical prior art laser scanning system an object or a region of interest is illuminated using a scanning mirror, electro-optic device or by sequentially illuminating a laser array such as a VCSEL array. One disadvantage is that the conventional optical sources are not available in a compact size and high output power due to mechanical scanning apparatus, thereby, limiting the range and accuracy. Furthermore, the scanning method using traditional scanning mirror apparatus provides mostly lateral information in 2-dimensions and limited distance or depth information.

Figure 12:
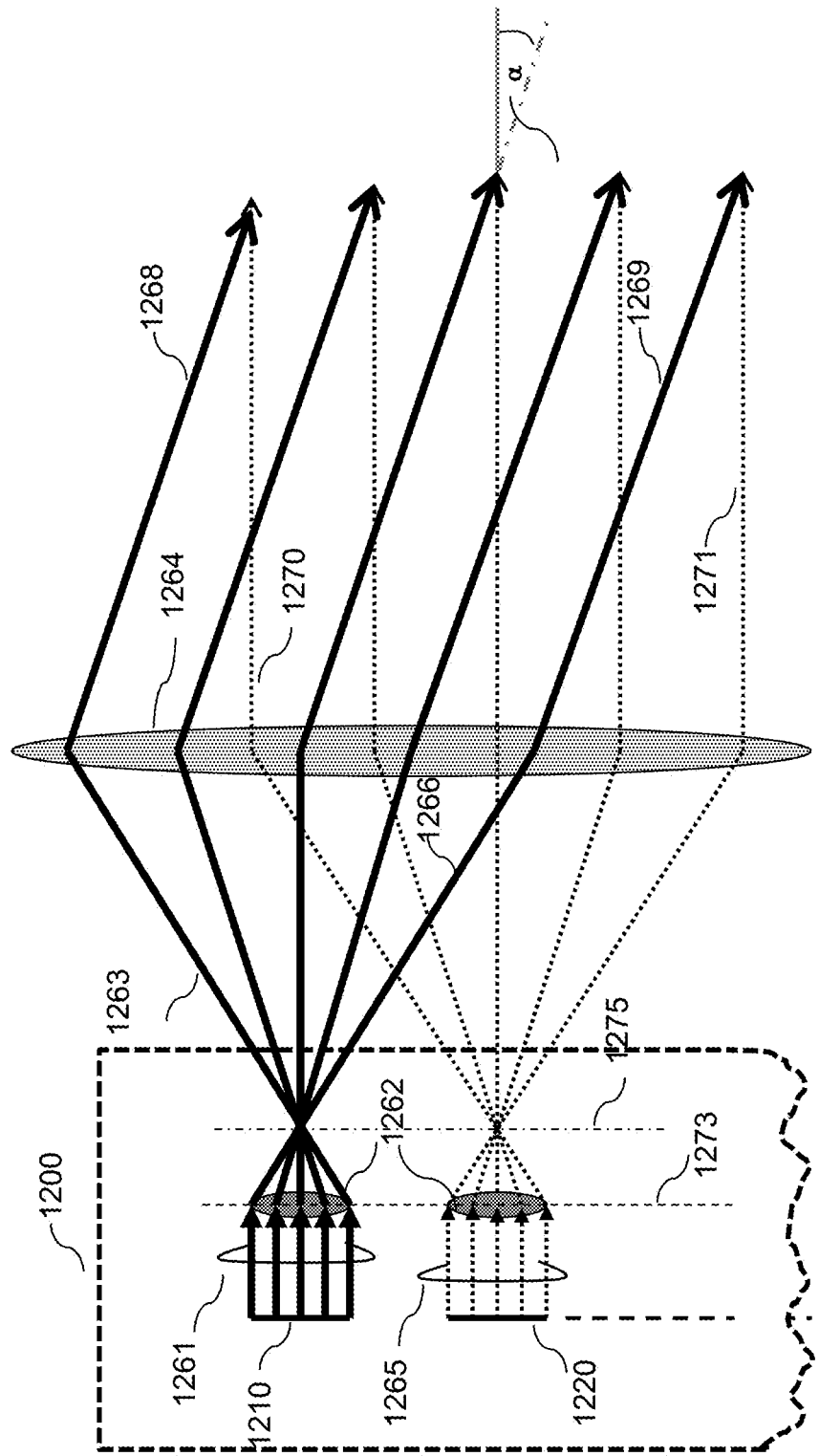
FIG. 12 shows an lightfield illumination source adopted for illuminating an object for 3-D sensing/scanning/imaging.

One embodiment of a lightfield optical source to be used in a scanning apparatus is shown in FIG. 12. A lightfield optical source embodies principle of a lightfield imaging known in the art, but in a reverse sense. Basically, instead of imaging a region of interest on an image plane, the principle of lightfield is applied to generate a scanning beam to illuminate a region of interest in a pre-determined timing sequence. The lightfield optical source is configured using VCSEL array or preferably, a VCSEL array chip (including a plurality of VCSEL arrays). More specifically, the lightfield optical source 1200 includes a VCSEL array chip comprising one or more VCSEL arrays (1210, 1220 . . . ). Each VCSEL array on the array chip emits a respective set of beams either in a pre-determined timing sequence or collectively, represented as group of beams 1261, 1265 . . . (only two sets shown for clarity as solid lines and dotted lines, respectively). In effect, each VCSEL array may be visualized as an individually addressable VCSEL array source. In operation, each VCSEL array source activated in a pre-determined timing sequence would generate a scanning beam or may be programmed to direct a beam to a particular location in the region of interest, as will be described shortly.

Following the array chip is positioned a microlens array 1273, such that each VCSEL array source aligns and registers with a corresponding microlens 1262. Each set of beams (1261, 1265 etc.) pass through a respective microlens to an imaging lens 1264. The imaging lens focuses diverging beams 1263 and 1266 (solid lines) from the microlens element into a collimated set of beams 1268 and 1269. To maintain clarity, only two extreme beams in the set are labeled but the description applies to all the beams in each set which collectively will be in the form a solid cone or beam of radiation. It is further noted that the description provided for the first set of beams 1261 is equally pertinent for other sets of beams for example, 1265 and those emitted from other VCSEL array sources that may be positioned further down the dash line shown extending beyond the two VCSEL array sources 1210 and 1220 shown in this illustration.

It can be easily visualized that a plurality of VCSEL array sources in the arrangement shown in FIG. 12 would generate several groups of collimated beams for example, 1268 and 1269 and 1270 and 1271 (only two extreme ones in each set are shown for clarity), respectively, from the VCSEL array sources 1210 and 1220. Each group of collimated beams emerges at a different angle with respect to a normal to the plane of the imaging lens. For example, the group of collimated beams 1268 and 1269 (solid lines) and 1270 and 1271 (dotted lines) emerging respectively, from VCSEL array sources 1210 and 1220, form angles α and 0, respectively, in this illustration. Relative positions of the microlens array and the imaging lens may be adjusted for a desired illumination pattern. For example, as shown in this illustration, the microlens array is located near the object plane of the imaging lens 1264. In another application the microlens focal plane 1275 may be located at the object plane of the imaging lens 1264. It is noted that the examples of different arrangement are only illustrative and should not be construed as limiting.

The lightfeild optical source may be operated in different modes to generate a scanning beam. In one embodiment, all the VCSEL array sources may be operated sequentially resulting in a raster type scanning beam. In another embodiment the VCSEL array sources may be operated in random or in a programmed sequence to generate beams directed to specific locations of the region of interest. The angle of the scanning beam would be determined by the relative position of the specific VCSEL source being operational. It can be further appreciated that different parts of a region of interest may be illuminated by selectively operating different VCSEL array sources according to the requirements of a particular application. The size of the scanning beam is determined by the number of VCSELs operated together in each source. For example, if all the VCSEL in a VCSEL array source are operated at the same time a large diameter scanning beam is generated. If a smaller subset of VCSELs in each source is operated at a time, the resulting scanning beam will be proportionally smaller.

Figure 13:
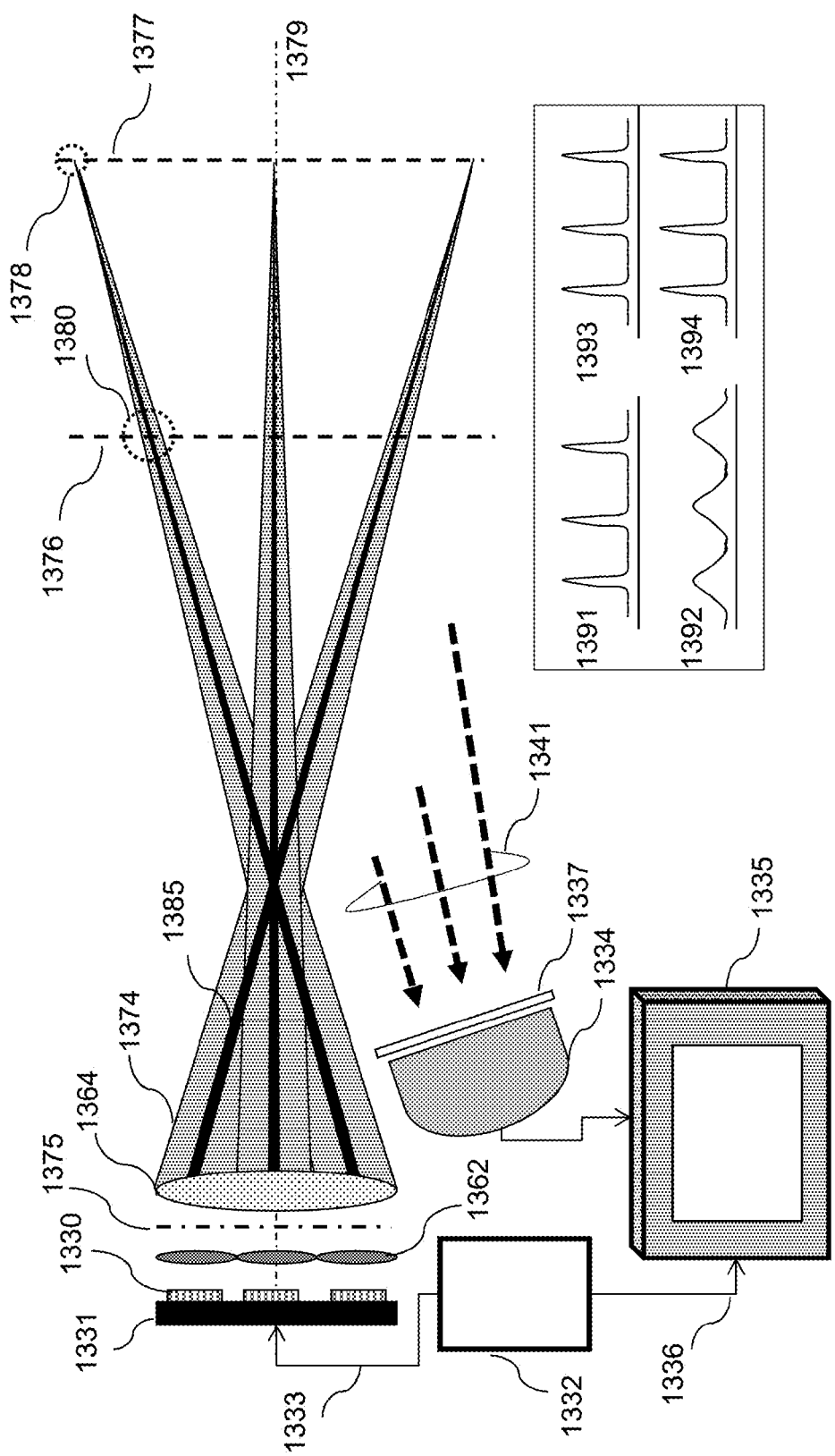
FIG. 13 shows adaptation of lightfield illumination source in a 3-D sensing, imaging and scanning apparatus.

FIG. 13 shows an example of applying the lightfield optical source in a scanning apparatus to scan a region or objects present in a region of interest. As described earlier, a lightfield scanning beam is generated using a plurality of VCSEL arrays 1330, each one when operated in an addressable mode is effectively a separate VCSEL array source. The VCSEL array sources may be constructed monolithically as an array chip. Alternatively, the VCSEL array sources may be assembled on a foreign substrate. The VCSEL array sources are mounted on a thermal submount 1331. An array of microlens 1362 is placed in front of the VCSEL array chip, such that each microlens in the array is registered with a corresponding VCSEL array source.

An imaging lens 1364 is placed at a distance from the array of microlens such that an image of the microlens array or its focal plane 1375 may be imaged at a distance away from the imaging lens. The distance between the microlens array and the imaging lens is selected such that each scanning beam is sharply focused on a plane located at the farthest imaging distance to be covered. For example, scanning beams 1374 and 1385 are focused at the farthest plane 1377 to a substantially equal small size beam (shown with a circle 1378), whereas at a plane 1376 that is at a shorter distance the same scanning beams are of different diameters (shown with a circle 1380). Therefore, it can be visualized that the radiation reflected from objects placed at different distances would have different characteristics when received at a receiver 1334.

Reflected signals (collectively shown as 1341) detected by the receiver and recorded in the processor 1335 reflect these differences in respective signal waveforms. Representative waveforms are schematically shown in the inset. More specifically, signals 1393 and 1394 resulting from reflected radiation originating from the farther plane 1377 (scanning beams having same size) are both high resolution signals. However, signals 1391 and 1392 resulting from reflected radiation originating at the closer plane 1376 (scanning beams of different sizes) are of different resolution. The signal from the small beam 1391 is a high resolution signal whereas the signal from the large beam 1392 is lower resolution. An optional optical filter 1337 is positioned before the receiver to improve the OSNR of the detected signal similar to that described in reference with embodiments shown and described earlier in reference with FIGS. 7-11.

The typical detector signals 1391, 1392, 1393, and 1394 shown in the inset of FIG. 13 also reflect variation in amplitude representing the variations in radiation reflected from objects in the region. The processor analyzes the detector signals 1391, 1392, 1393 and 1394 by spatial frequency analysis using a time synchronization signal 1336 received from the current driver 1332, to determine the distance of different parts of an object, or different objects in the region of interest. Furthermore, the lateral position of different parts of an object, or different objects is determined by synchronizing the detected reflected radiation with the driver current supplied by the current driver 1332 that activates each VCSEL source. More specifically, the programmable current driver is set to activate different VCSEL array sources with different numbers of elements activated and synchronize the signal detected by the receiver in a pre-programmed sequence to determine the lateral positions to compute a 3-dimensional image of the region.

The optical scanning apparatus configured to in the lightfield scanning mode using VCSEL arrays as sources in various forms, provides a very flexible and dynamically adaptable beam scanning system to obtain three dimensional images of a region. The addressable VCSEL source may be programmed electronically to activate different subsets of VCSEL elements in the arrays to generate different beam sizes to adapt to different imaging requirements. Thus the scanning beam can be dynamically adapted to different imaging situations, for example, direction and size of the scanning beam may be changed to change to a fast response to an actively changing scene in a field application.

From the description provided in the previous sections, it can be appreciated that the principles of this invention may be applied to construct a wide range of devices for proximity sensing, distance measurement and for generating two and three dimensional images of regions. The modular aspect of the designs is particularly attractive for easy expansion and reducing manufacturing cost by producing the modules in large volumes. Since VCSELs can be constructed using different materials, different wavelength emission devices may be combined together in a modular fashion to create devices for operation in different application environments. These and other advantages of the principles disclosed here will be apparent to those skilled in the art.

Although a broad framework of the invention is described with reference to a few preferred embodiments, other embodiments may be configured by applying combinations and sub-combinations of elements described herein, depending on particular proximity detection or imaging application.

Variations and modifications of different embodiments that will be apparent to those skilled in the art are within the scope of the invention and are covered by appended claims.

What is claimed is:

1. A scanning apparatus comprising:
a lightfield optical source including,
a VCSEL array chip including more than one VCSEL array disposed in a 2-D spatial arrangement, each one of said more than one VCSEL array further including a plurality of VCSELs disposed in a 2-D spatial arrangement, wherein the 2-D spatial arrangement of said more than one VCSEL array as well as the 2-D spatial arrangement of the plurality of VCSELs is one selected from a group consisting of a regular, a non-regular, a randomly spaced and a combination thereof,
an array of microlens positioned at a pre-determined distance from the plurality of VCSELs, wherein each microlens is aligned and registered with a pre-determined one or more of the plurality of VCSELs, or with each one of said more than one VCSEL array, and
an imaging lens disposed at a pre-determined distance from the array of microlens, such that the array of microlens is located between the plurality of VCSELs and the imaging lens to focus radiation emitted by the plurality of VCSELs at an imaging plane located distal from the plurality of VCSELs; and
an electronic instrument including, a programmable current driver, a data storage device, and a processor, wherein the current driver operates said more than one VC SEL array in a desired timed sequence to generate a set of scanning beams of variable size to illuminate one or more object in a desired timed sequence, wherein the current driver is configured to drive the plurality of VCSELs using pulses of drive current such that the set of scanning beams are generated as pulses of radiation; and
said scanning apparatus further including a radiation detection apparatus including a plurality of photodetectors having a rise and a fall time substantially matched with a rise and a fall time of the pulses of radiation, such that distance of the one or more object is determined by measuring a respective time of flight between the scanning pulses illuminating the one or more object, and corresponding reflected radiation pulses received from the one or more object, said respective time of flight is measured synchronized with the pulses of drive current to determine the distance of the one or more object, and by further measuring intensity and pulse shape of the corresponding reflected radiation pulses received at the radiation detection apparatus to determine an intensity profile of the one or more object so as to compute an image of the one or more object.

2. The scanning apparatus as in claim 1, wherein the plurality of VCSELs have a planar structure in a high output power configuration that is one selected from a group consisting of two-reflector device, extended cavity integrated three-reflector device and extended cavity external three-reflector device.

3. The scanning apparatus as in claim 1, wherein the plurality of VCSELs is monolithically integrated or assembled on a common foreign substrate, and wherein each VCSEL is electrically connected in individually addressable configuration.

4. The scanning apparatus as in claim 1, wherein the 2-D spatial arrangement of plurality of VCSELs in each one of said more than one VC SEL array is one selected from a group consisting of a group, cluster, array and a combination thereof, that is electrically connected in individually addressable configuration.

5. The scanning apparatus as in claim 1, wherein the radiation detection apparatus is one selected from a group consisting of an analog camera, a digital camera, a charge coupled detector, a photodetector, and an array of photodetectors.

6. The scanning apparatus as in claim 1, further including an optical filter proximal to the light detection apparatus, wherein the pass band of said optical filter substantially matches the emission wavelength of the plurality of VCSELs.

7. An imaging apparatus comprising:
a lightfield optical source including,
a plurality of VCSELs disposed in a 2-D spatial arrangement to generate one or more optical beams,
an array of microlens positioned at a pre-determined distance from the plurality of VCSELs, wherein each microlens is aligned and registered with a pre-determined one or more of the plurality of VC SELs, and
an imaging lens disposed at a pre-determined distance from the array of microlens, such that the array of microlens is located between the plurality of VCSELs and the imaging lens to focus radiation emitted by the plurality of VCSELs at an imaging plane located distal from the plurality of VC SELs;
a radiation detection apparatus co-located with the optical source in at least one plane, and separated in one orthogonal plane in the physical space, wherein the radiation detection apparatus is disposed at a pre-determined angle with respect to the imaging plane; and
an electronic instrument including, a programmable current driver, a data storage device and a processor, wherein
the programmable current driver operates a different section of the 2-D spatial arrangement of the plurality of VCSELs to generate multiple sets of scanning beams in a pre-determined timed sequence to illuminate a corresponding different section of one or more object from a pre-determined fixed angle,
the radiation detection apparatus generates one or more electrical signal proportional to reflected radiation received sequentially form the one or more object at said pre-determined angle, and
the processor applies one or more signal processing operation to the one or more electrical signals in synchronization with the pre-determined timed sequence of the scanning beams, such that a time of flight and an intensity profile corresponding to different sections of the one or more object is determined to compute a distance and an image of the one or more object.

8. The imaging apparatus as in claim 7 wherein the plurality of VCSELs have a planar structure that is one selected from the group consisting of two-reflector device, extended cavity three-reflector device and extended cavity external three-reflector device.

9. The imaging apparatus as in claim 7, wherein the plurality of VCSELs is monolithically integrated or assembled on a common foreign substrate, and wherein each VCSEL is individually addressable.

10. The imaging apparatus as in claim 7, wherein the 2-D spatial arrangement is one selected from a group consisting of a group, cluster, array and a combination thereof, that is individually addressable or operated collectively.

11. The imaging apparatus as in claim 7, wherein the optical source further includes additional plurality of VCSELs arranged in one or more additional 2-D spatial arrangement that is one selected from a group consisting of a group, cluster, array and a combination thereof, that is individually addressable or operated collectively.

12. The imaging apparatus as in claim 7 wherein:
the current driver is configured to drive the plurality of VCSELs using pulses of drive current so as to generate the multiple sets of scanning beams in pulses or radiation; and
the radiation detection apparatus includes a plurality of photodetectors having a rise and a fall time substantially matched with a rise and a fall time of the pulses of the radiation from the multiple sets of scanning beams, such that distance of the one or more object from the optical source is determined by measuring a time of flight between the pulses of radiation from the multiple sets of scanning beams, and corresponding reflected radiation pulses received from the one or more object, said respective time of flight is measured synchronized with the pulses of drive current.

13. The imaging apparatus as in claim 7, wherein the radiation detection apparatus is one selected from a group consisting of an analog camera, a digital camera, a charge coupled detector, a photodetector, and an array of photodetectors.

14. The imaging apparatus as in claim 7 further including an optical filter proximal to the light detection apparatus, wherein the pass band of said optical filter substantially matches with the emission wavelength of the plurality of emitters.

15. The imaging apparatus as in claim 7 wherein the radiation detection apparatus comprises:

a plurality of photodetectors arranged in a pre-determined 2-D spatial arrangement, and
a plurality of microlens positioned between the one or more object and the plurality of photodetectors, wherein the each microlens is registered with one or more of the plurality of photodetectors, such that each microlens focuses reflected light received in proportion to the distance of the corresponding different sections of the one or more object on to the respective photodetector.

16. The imaging apparatus of claim 15, wherein the pre-determined 2-D spatial arrangement of the plurality of photodetectors is one selected from a group consisting of a group, cluster, array, and a combination thereof.

17. The imaging apparatus of claim 15, wherein the pre-determined 2-D spatial arrangement of the plurality of photodetectors and the plurality of microlens is similar.

18. The imaging apparatus of claim 15, wherein the 2-D spatial arrangement of the plurality of VCSELs and the 2-D spatial arrangement of the plurality of photodetectors is substantially similar.

19. The imaging apparatus of claim 15, wherein the plurality of photodetectors are equivalent of individual pixels of a digital camera.

20. The imaging apparatus as in claim 7, wherein the 2-D spatial arrangement of plurality of VCSELs is one selected from a group consisting of a group, cluster, array and a combination thereof, that is electrically connected as individually addressable one or more VCSEL array.

* * * * *